United States Patent
Namiki et al.

(10) Patent No.: US 8,493,788 B2
(45) Date of Patent: Jul. 23, 2013

(54) SEMICONDUCTOR MEMORY DEVICE AND CONTROL METHOD THEREOF

(75) Inventors: Yuko Namiki, Yokohama (JP); Mitsuaki Honma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 168 days.

(21) Appl. No.: 13/038,928

(22) Filed: Mar. 2, 2011

(65) Prior Publication Data
US 2011/0216599 A1    Sep. 8, 2011

(30) Foreign Application Priority Data
Mar. 3, 2010 (JP) .................. 2010-047015

(51) Int. Cl.
*G11C 11/34* (2006.01)
*G11C 16/04* (2006.01)

(52) U.S. Cl.
CPC .................. *G11C 16/0483* (2013.01)
USPC ............ 365/185.18; 365/185.17; 365/185.22; 365/185.24; 365/185.23

(58) Field of Classification Search
CPC .. G11C 16/0483; G11C 16/3454; G11C 16/10; G11C 16/344; G11C 16/3459; G11C 16/3436
USPC ............... 365/185.17, 185.18, 185.2, 185.22, 365/185.29
See application file for complete search history.

(56) References Cited

U.S. PATENT DOCUMENTS

2005/0018484 A1    1/2005   Sakuma et al.
2010/0061151 A1*   3/2010   Miwa et al. .............. 365/185.17
2010/0142271 A1    6/2010   Honma et al.

FOREIGN PATENT DOCUMENTS

JP    2002-279788    9/2002
JP    2005-25898     1/2005

OTHER PUBLICATIONS

U.S. Appl. No. 13/175,176, filed Jul. 1, 2011, Futatsuyama, et al.
Japanese Office Action mailed on Feb. 26, 2013, in Japanese Patent Application No. 2010-047015 filed on Mar. 3, 2010 (with English Translation).

* cited by examiner

*Primary Examiner* — Thong Q Le
(74) *Attorney, Agent, or Firm* — Oblon, Spivak, McClelland, Maier & Neustadt, L.L.P.

(57) ABSTRACT

According to one embodiment, a semiconductor memory device includes a memory cell array, a column decoder, and a control circuit configured to control the memory cell array and the column decoder. The control circuit is configured to load program data from outside, to execute a first data program in a first even-numbered bit line, to execute a second data program in a first odd-numbered bit line, to execute a verify read of the programmed bit lines, to determine whether a value of the verify read is programmed up to a predetermined threshold value, and to change, in a case where the value of the verify read fails to be programmed to the predetermined threshold value, an order of the first and second data programs, to execute the second data program in the first odd-numbered bit line, and then to execute the first data program in the first even-numbered bit line.

20 Claims, 23 Drawing Sheets

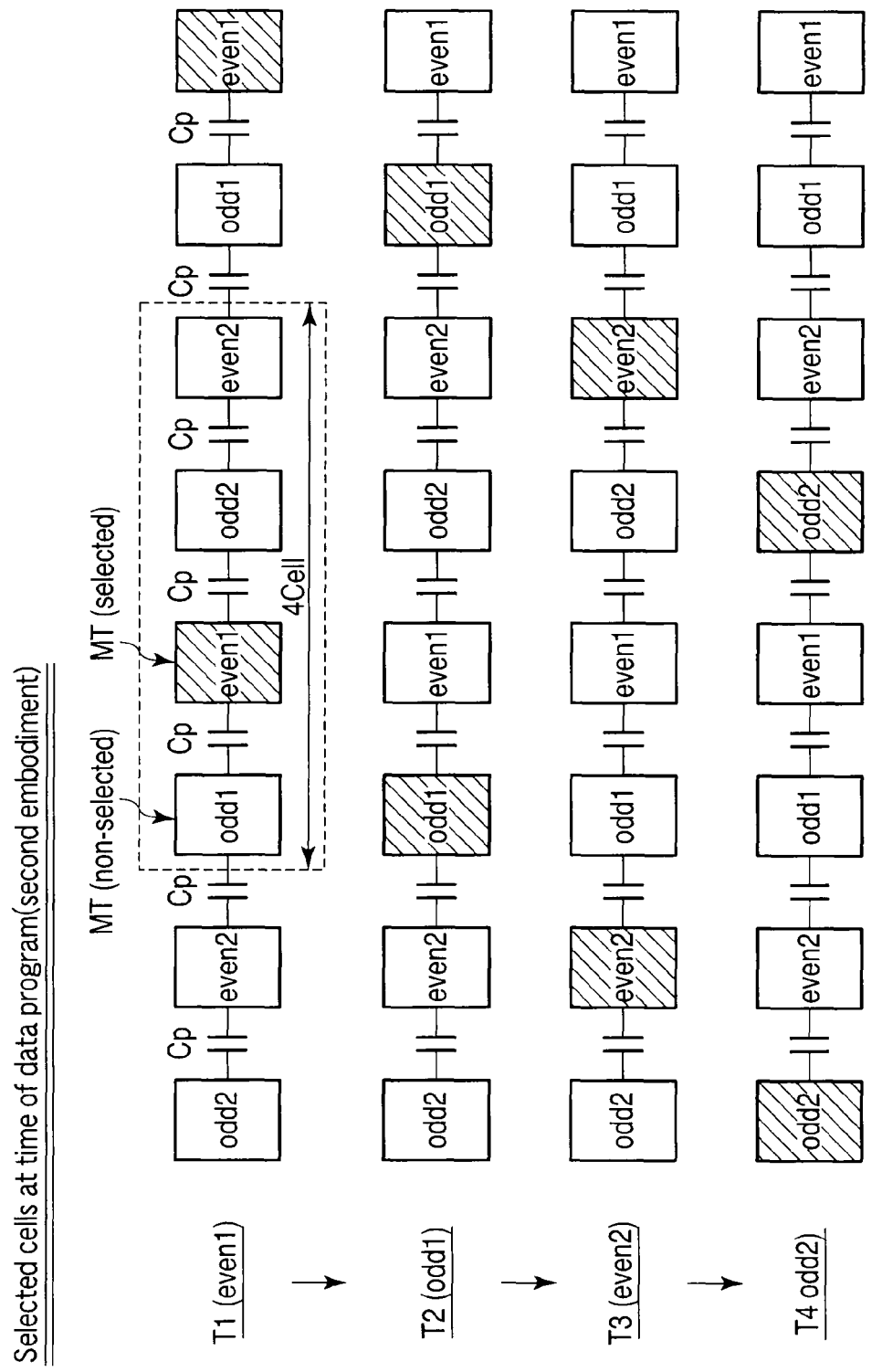
F I G. 10

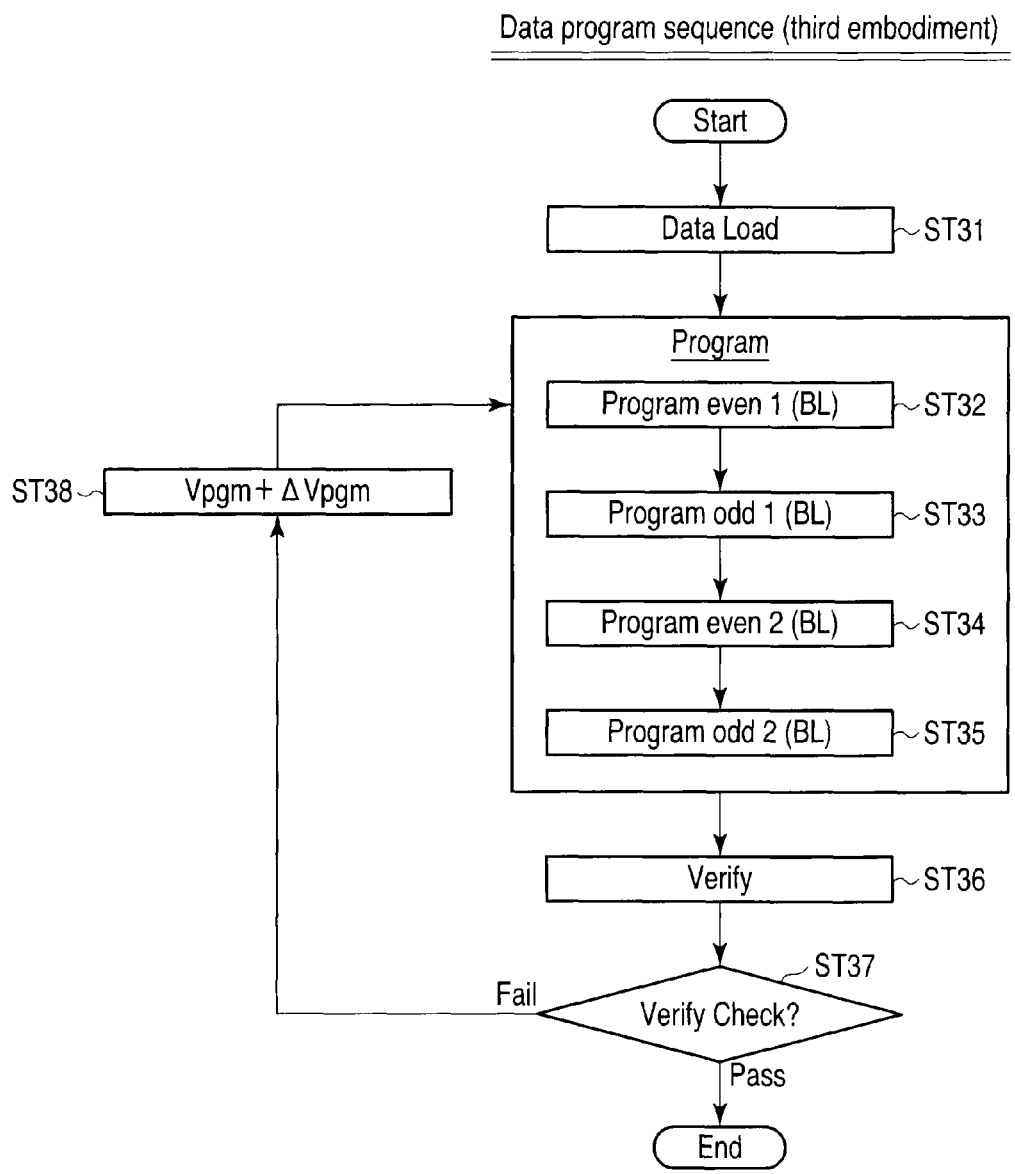
F I G. 14

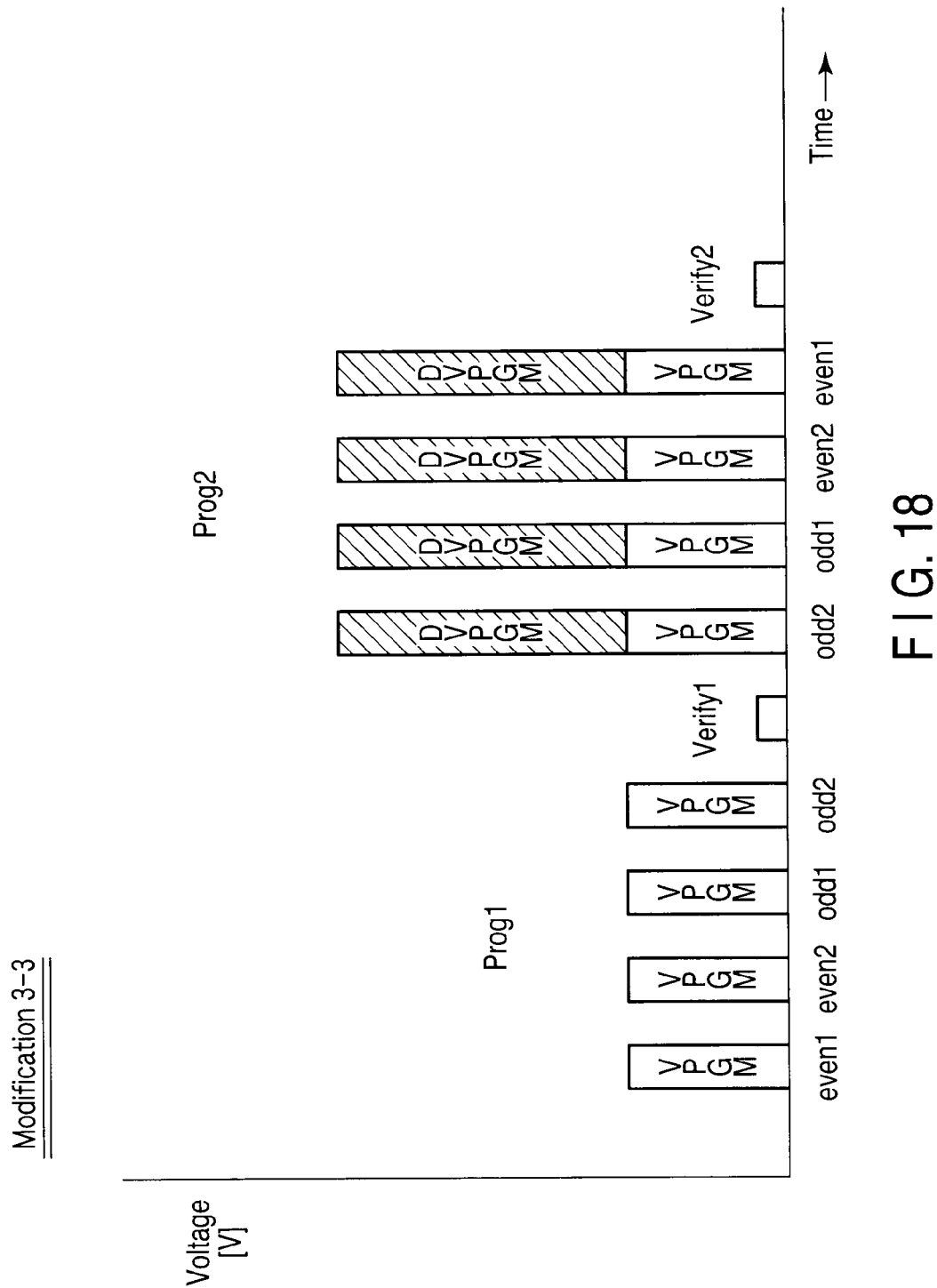
F I G. 18

SEMICONDUCTOR MEMORY DEVICE AND CONTROL METHOD THEREOF

CROSS-REFERENCE TO RELATED APPLICATIONS

This application is based upon and claims the benefit of priority from Japanese Patent Application No. 2010-047015, filed Mar. 3, 2010; the entire contents of which are incorporated herein by reference.

FIELD

Embodiments described herein relate generally to a semiconductor memory device and a control method thereof.

BACKGROUND

In a semiconductor memory device, for example, in a NAND flash memory, when a data write (data program) operation is executed, there is a case in which data program is executed separately in an even-BL (bit line) and an odd-BL (bit line). With the advancement of the generation, a parasitic capacitance has been increasing between neighboring BLs and between neighboring cells, leading to a greater interference effect between cells. In order to reduce the influence of an interference effect between neighboring cells in the BL direction, it is effective to divide neighboring bit lines BL0, BL1, BL2, . . . , into even-numbered BLs (even (BL)) and odd-numbered BLs (odd (BL)), and not to execute data program in the neighboring BLs at the same time (e.g. Jpn. Pat. Appln. KOKAI Publication No. 2002-279788).

According to this method, when data program is executed on the even (BL) side, the odd (BL) side is non-selected, and when data program is executed on the odd (BL) side, the even (BL) side is non-selected.

BRIEF DESCRIPTION OF THE DRAWINGS

FIG. 10 illustrates capacitive coupling at a time of data program of the semiconductor memory device according to the second embodiment;

FIG. 14 is a flow chart illustrating a data program sequence of a semiconductor memory device according to a third embodiment;

FIG. 18 is a timing chart illustrating a data program sequence of a semiconductor memory device according to Modification 3-3;

DETAILED DESCRIPTION

Figure 1:
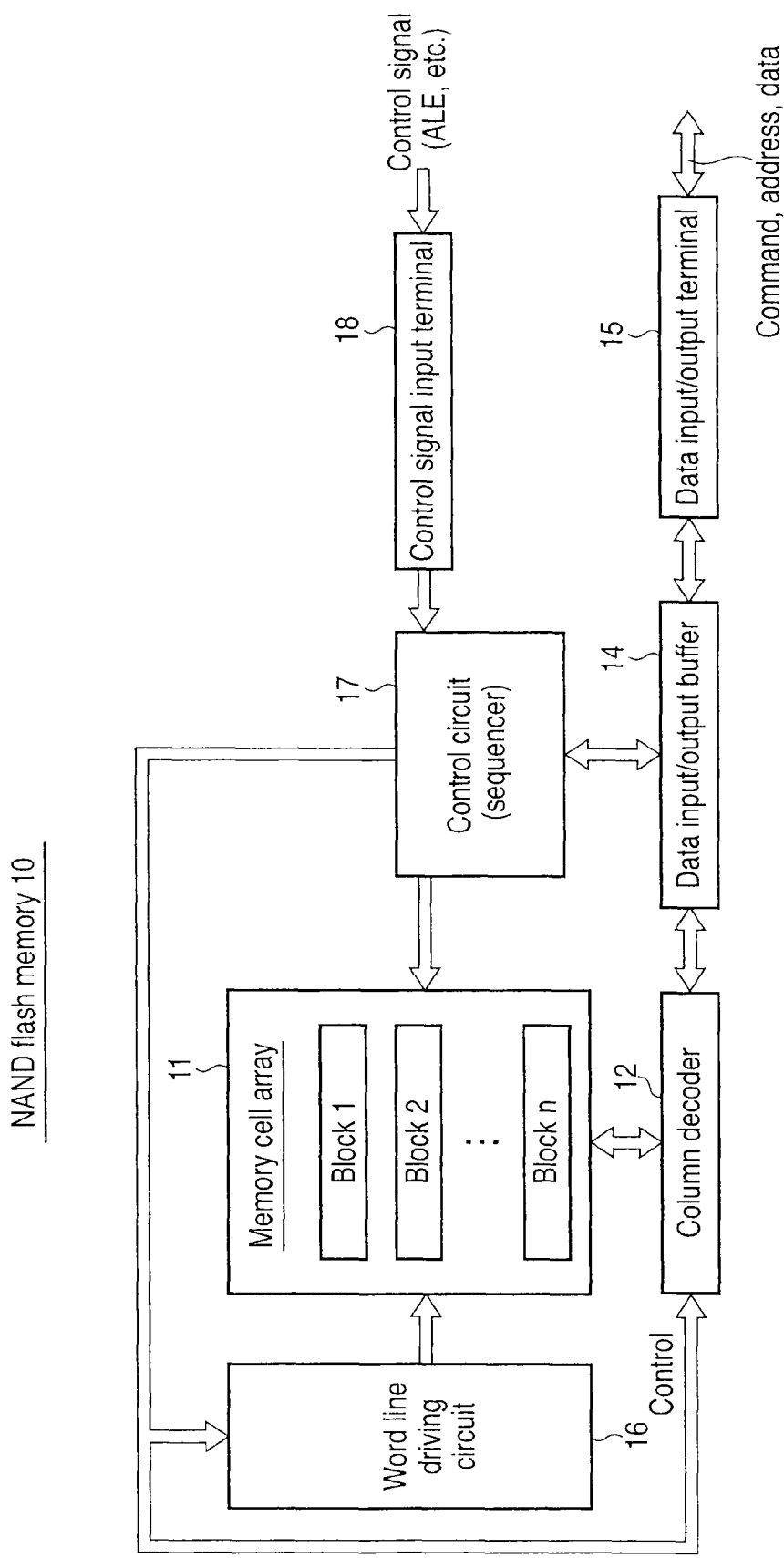
FIG. 1 shows the entire structure of a semiconductor memory device according to a first embodiment.

In general, according to one embodiment, a semiconductor memory device includes a memory cell array including a plurality of memory cells which are arranged at intersections between a plurality of bit lines and a plurality of word lines; a column decoder configured to apply a program voltage to the memory cells via the bit lines; and a control circuit configured to control the memory cell array and the column decoder. The control circuit is configured to load program data from outside; to execute a first data program in a first even-numbered bit line; to execute a second data program in a first odd-numbered bit line; to execute a verify read of the programmed bit lines; to determine whether a value of the verify read is programmed up to a predetermined threshold value; and to change, in a case where the value of the verify read fails to be programmed to the predetermined threshold value, an order of the first and second data programs, to execute the second data program in the first odd-numbered bit line, and then to execute the first data program in the first even-numbered bit line.

According to the method described in the above prior art, when data write (data program) is executed on the even (BL) side, the odd (BL) side is non-selected, and when data write is executed on the odd (BL) side, the even (BL) side is non-selected. In the above method, the order of data program on the even (BL) side and data program on the odd (BL) is fixed. For example, after data program in the even (BL), data program is executed in the odd (BL). At this time, data program is executed more strongly on the even (BL) side due to the effect of capacitive coupling. The reason for this is that since data program on the odd (BL) side is always executed after data program on the even (BL) side, the threshold distribution of the even (BL) side is broadened due to the effect of the subsequently executed data program on the odd (BL) side.

As a result, the threshold distribution of the odd (BL) side becomes broader than the threshold distribution of the even (BL) side. In this manner, there is a tendency that the threshold distribution is broadened and the read margin decreases.

If the generation further advances, as in the case where the minimum feature dimension, such as the BL width of the interval between neighboring BLs, decreases to less than about 25 nm, there occurs an inter-cell interference effect from not only the neighboring bit line BL, but also from a further neighboring bit line BL which neighbors the neighboring bit line BL. In order to reduce the influence of the interference effect between the cells in the direction of the neighboring BLs, the above-described method of dividing the BLs into the even (BL) and odd (BL) is effective. However, the influence from the further neighboring BL which neighbors the neighboring BL cannot be reduced. A proposal to eliminate this influence is also desired.

Embodiments will now be described with reference to the accompanying drawings. In the description below, common parts are denoted by common reference numerals throughout the drawings. In the embodiments, a NAND flash memory is described as an example of the semiconductor memory device.

[First Embodiment]

Referring to FIG. 1 to FIG. 7, a semiconductor memory device according to a first embodiment is described.

<1. Structure Example>

1-1. Entire Structure Example

To begin with, referring to FIG. 1, an entire structure example of a NAND flash memory according to the first embodiment is described.

As shown in FIG. 1, the NAND flash memory according to the first embodiment comprises a memory cell array 11, a column decoder 12, a data input/output buffer 14, a data input/output terminal 15, a word line driving circuit 16, a control circuit 17, and a control signal input terminal 18.

The memory cell array 11 comprises a plurality of blocks (BLOCK1 to BLOCKn). Each of the blocks (BLOCK1 to BLOCKn) comprises a plurality of memory cells which are arranged in a matrix at intersections between a plurality of word lines and a plurality of bit lines. The word line driving circuit 16 which controls the word lines, the column decoder 12 which controls the bit lines and the control circuit 17 are electrically connected to the memory cell array 11.

In the case of this example, a parameter, etc. for executing a data program sequence according to the present example which will be described later, are recorded in the block BLOCK1 (ROM FUSE BLOCK). The parameter, etc. are read out from the ROM FUSE BLOCK, for example, when the NAND flash memory 10 is powered on. Then, the parameter, etc. are read in a register, or the like, in the control circuit 17, and are used when the data write (data program) operation of the NAND flash memory is executed. This will be described later.

In the blocks (BLOCK2 to BLOCKn), for example, general data such as user data is written (programmed), read or erased.

The column decoder 12 reads out data of memory cells in the memory cell array 11 via the bit lines, and detects the states of the memory cells in the memory cell array 11 via the bit lines. In addition, the column decoder 12 applies a write control voltage to the memory cells in the memory cell array 11 via the bit lines, in accordance with the control of the control circuit 17, thereby executing data write (data program) in the memory cells. The data input/output buffer 14 is connected to the column decoder 12.

The data of the memory cell, which is selected and read by the column decoder 12, is output to the outside from the data input/output terminal 15 via the data input/output buffer 14. The data input/output terminal 15 is connected to, for example, an external memory controller or a host apparatus.

The host apparatus is, for example, a microcomputer, and receives data which is output from the data input/output terminal 15. Further, the host apparatus outputs various commands (Command), addresses (Address) and write data (Data), which control the operation of the NAND flash memory. The write data, which is input from the host apparatus to the data input/output terminal 15, is supplied via the data input/output buffer 14 to the data memory circuit (not shown) which is selected by the column decoder 12. On the other hand, the various commands (Command) and the address (Address) are supplied to the control circuit 17.

The word line driving circuit 16 selects a word line in the memory cell array 11 according to the control of the control circuit 17, and applies to the selected word line a voltage necessary for data read, data write (data program) or erase.

The control circuit 17 supplies necessary control signals and control voltages to the respective circuits which are electrically connected to the control circuit 17. The control circuit 17 is electrically connected to the memory cell array 11, column decoder 12, data input/output buffer 14, and word line driving circuit 16. These connected structural circuits are controlled by the control circuit 17. The control circuit 17 is connected to the control signal input terminal 18, and is controlled by a control signal, such as an ALE (address latch enable) signal, which is input from the external host apparatus via the control signal input terminal 18. In addition, the control circuit 17 includes an internal voltage generation circuit, and supplies control voltages necessary for the operation of the connected structural circuits.

The column decoder 12, data input/output buffer 14, word line driving circuit 16 and control circuit 17 constitute a write (program) circuit, a read circuit and an erase circuit.

1-2. Structure Example of Block (BLOCK1)

Figure 2:
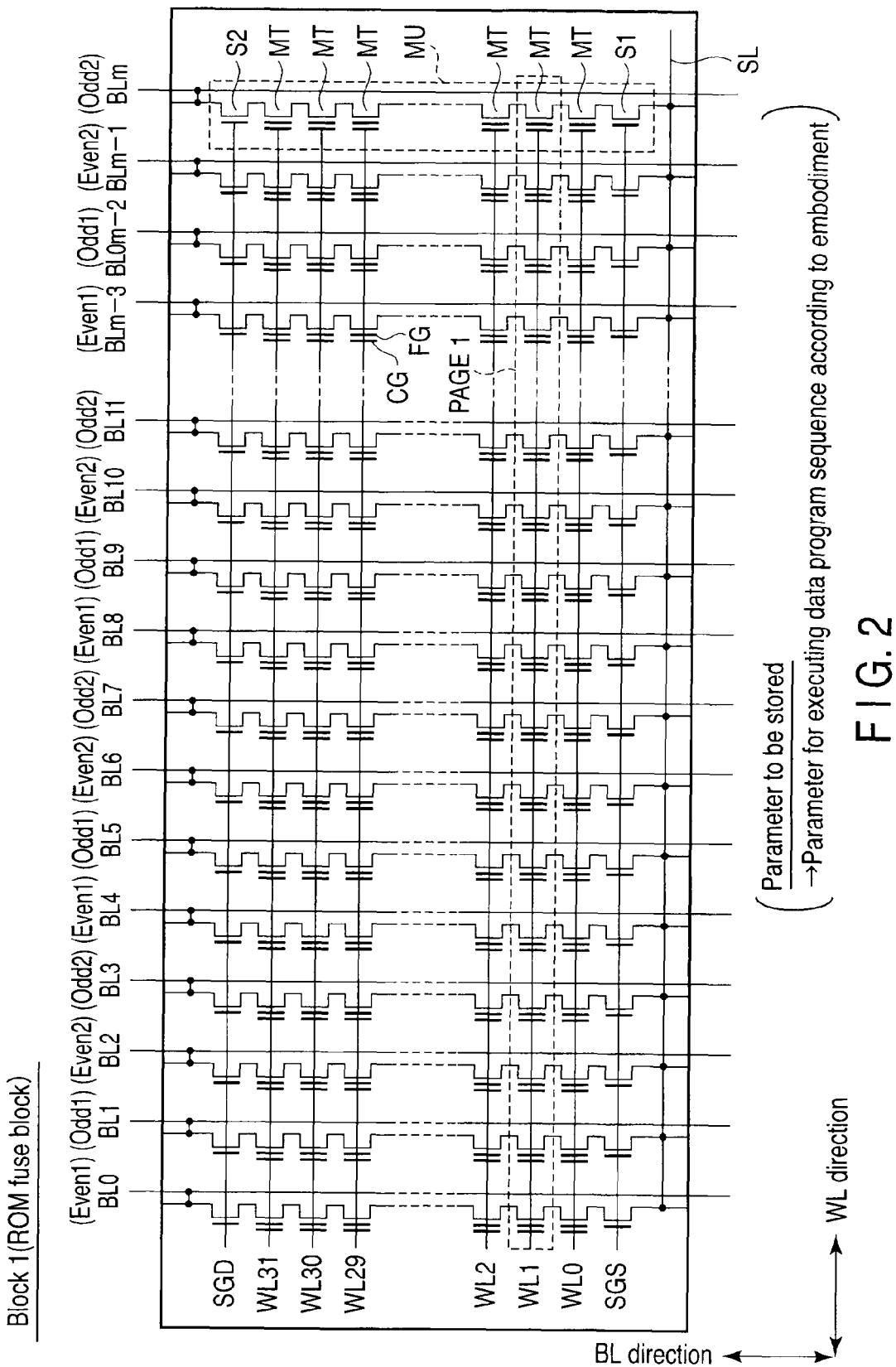
FIG. 2 is an equivalent circuit diagram showing a block (BLOCK) in FIG. 1.

Next, referring to FIG. 2, a structure example of the block (BLOCK), which constitutes the memory cell array 11 of the first embodiment, is described. One block (BLOCK1 (ROM FUSE BLOCK)) in FIG. 1 is described by way of example. The memory cells in the block BLOCK1 are erased batch-wise. Thus, the block is a data erase unit.

The block BLOCK1 comprises a plurality of memory cell units MU which are arranged in a word line direction (WL direction). The memory cell unit MU comprises a NAND string (memory cell string), a source-side select transistor S1 connected to one end of the current path of the NAND string, and a drain-side select transistor S2 connected to the other end of the current path of the NAND string. The NAND string comprises 32 memory cells MT which are arranged in a bit line direction (BL direction) crossing the word lines, and have current paths connected in series.

The memory cell (memory cell transistor) MT has a multilayer structure comprising a gate insulation film, a floating gate FG, an inter-gate insulation film and a control electrode layer CG, which are successively provided on a semiconductor substrate.

The other end of the current path of the source-side select transistor S1 is connected to a source line SL. The other end of the current path of the drain-side select transistor S2 is connected to one of bit lines BL in association with each memory cell unit MU.

Bit lines BL0 to BLm are numbered such that even-numbered bit lines BL are even 1 (BL) and even 2 (BL) and odd-numbered bit lines BL are odd 1 (BL) and odd 2 (BL). The even 2 (BL) is an even-numbered bit line neighboring the even 1 (BL). The odd 2 (BL) is an odd-numbered bit line neighboring the odd 1 (BL).

Word lines WL0 to WL31 extend in the WL direction, and is connected commonly to the control electrodes CG of the plural memory cells in the WL direction. A select gate line SGS extends in the WL direction, and is connected commonly to the plural select transistors S1 in the WL direction. Similarly, a select gate line SGD extends in the WL direction, and is connected commonly to the plural select transistors S2 in the WL direction.

A page (PAGE) is present in association with each of the word lines WL0 to WL32. For example, as indicated by a broken-line box in FIG. 2, a page (PAGE1) is present in association with the word line WL1. Since a read operation and a write operation (program operation) are executed in units of a page, the page is a data read unit and a data program unit.

As described above, in the case of this example, the page of the BLOCK1 (ROM FUSE BLOCK) functions as a memory circuit which records a parameter, etc. for executing the data program sequence according to the embodiment, which will be described later.

1-3. Re: Capacitive Coupling Between Neighboring Cells

Figure 3:
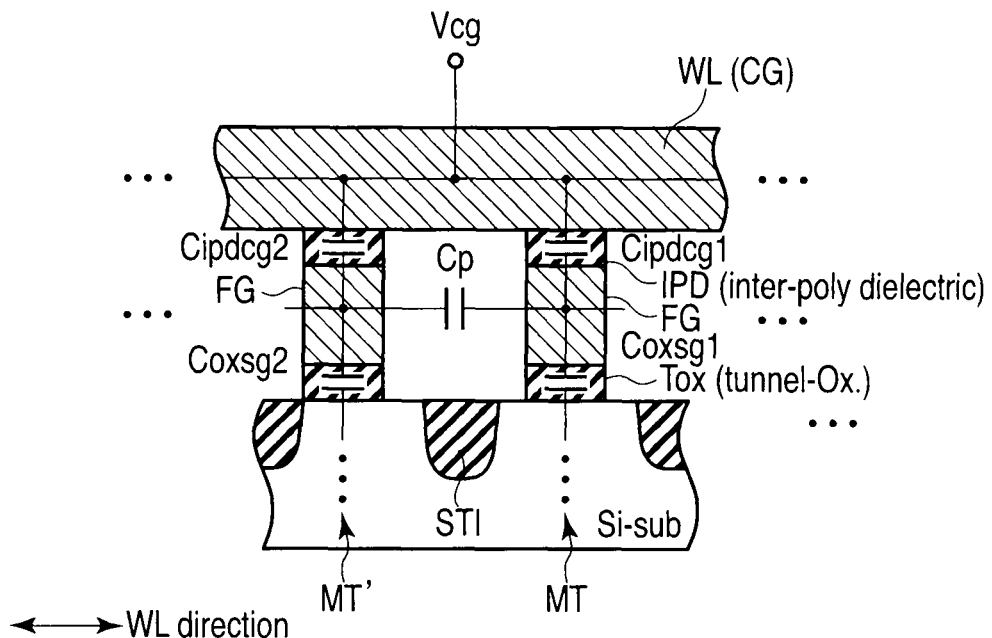
FIG. 3 is a cross-sectional view for explaining the effect of capacitive coupling.
Figure 4:
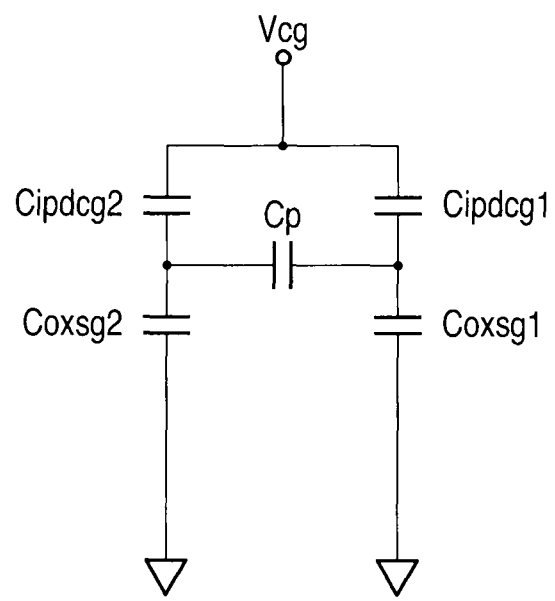
FIG. 4 is an equivalent circuit diagram showing capacitive coupling in FIG. 3.
Figure 5:
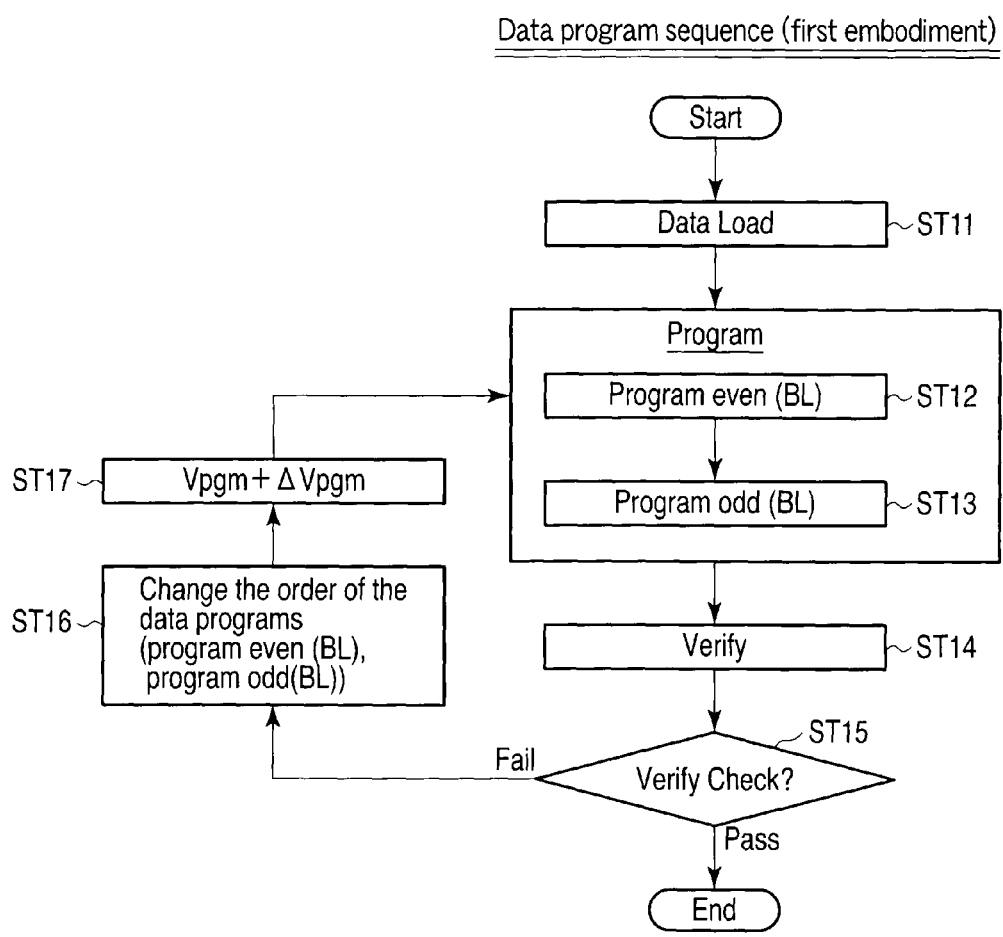
FIG. 5 is a flow chart illustrating a data program sequence of the semiconductor memory device according to the first embodiment.

Next, referring to FIG. 3 and FIG. 4, the capacitive coupling between neighboring cells in the embodiment is described.

FIG. 3 is a cross-sectional view illustrating capacitive coupling and an application voltage of memory cell transistors MT which neighbor in the word line direction (WL direction). FIG. 4 is an equivalent circuit diagram showing the capacitive coupling and application voltage illustrated in FIG. 3.

As shown in FIG. 3 and FIG. 4, at least capacitive couplings Cp, Cipdcg1, Cipdcg2, Coxsg1 and Coxsg2 are formed in the memory cell transistors MT neighboring in the word line direction, and an application voltage Vcg is applied to these memory cell transistors MT.

The capacitive coupling Cp is a capacitive coupling which is formed by the effect of a parasitic capacitance occurring between the floating gates FG which neighbor in the WL direction, with an interlayer insulation film (not shown) being interposed.

The capacitive coupling Cipdcg1, Cipdcg2, is formed by the effect of a parasitic capacitance occurring between the control gate CG and floating gates FG which neighbor each other, with an inter-gate insulation film IPD being interposed. The capacitive coupling Coxsg1, Coxsg2, is formed by the effect of a parasitic capacitance occurring between the floating gates FG and a semiconductor substrate 21 which neighbor each other, with a gate insulation film Tox being interposed.

The application voltage Vcg is an application voltage which is applied to the word line WL (control electrode) of the memory cell transistor MT1, for example, when a data program operation is executed.

As described above, the capacitive couplings Cp, Cipdcg1, Cipdcg2, Coxsg1 and Coxsg2 are present between the cells (neighboring bit lines BL) neighboring in the word line direction. The values of these capacitive couplings increase as the generation advances with the development of microfabrication of memory cells.

In particular, for example, when a data program operation is executed, if data program is executed in such an order that data program is executed in the odd (BL) after data program is executed in the even (BL), stronger data program is executed on the even (BL) side due to the effect of the parasitic capacitance Cp occurring between the floating electrodes FG. In the present embodiment, in order to reduce the effect of the parasitic capacitance, the following data program operation is proposed.

Detailed illustrations are omitted in connection with the capacitive coupling between cells neighboring in the bit line direction, the capacitive coupling between further neighboring cells, or the capacitive coupling in oblique directions.

<2. Data Program Operation>

Next, the data program operation of the NAND flash memory according to the first embodiment is described. This description will be given with reference to a flow chart of FIG. 5 and a timing chart of FIG. 6.

(Step ST11 (Data Load))

To start with, the control circuit 17 loads write data (program data) and corresponding addresses from the outside into the column decoder 12 via the data input/output terminal 15 and data input/output buffer 14.

(Step ST12 (Program Even (BL))

Then, the control circuit 17 writes data in the selected bit lines even (BL) (in this example, even 1 and even 2) (first data program). To be more specific, a program voltage pulse (VPGM, e.g. about 16 V) is applied to the selected word line WL, and electrons are injected in the floating electrode FG of the selected cell, thereby setting a predetermined threshold distribution (for example, in the case of a 2-value cell (SLC: Single level cell), the threshold distribution is changed in the following manner: "1" state→"0" state). In this case, the other bit lines (odd) are set in the non-write state (the same applies to the description below). After this step, program data and corresponding addresses may be loaded once again from the outside into the column decoder 12, as in the case of the above step ST11, but the illustration of this step is omitted here.

(Step ST13 (Program odd (BL)))

Subsequently, the control circuit 17 similarly writes data in the selected bit line odd (BL) (in this example, odd 1 and odd 2) (second data program).

(Step ST14 (Verify))

Figure 6:
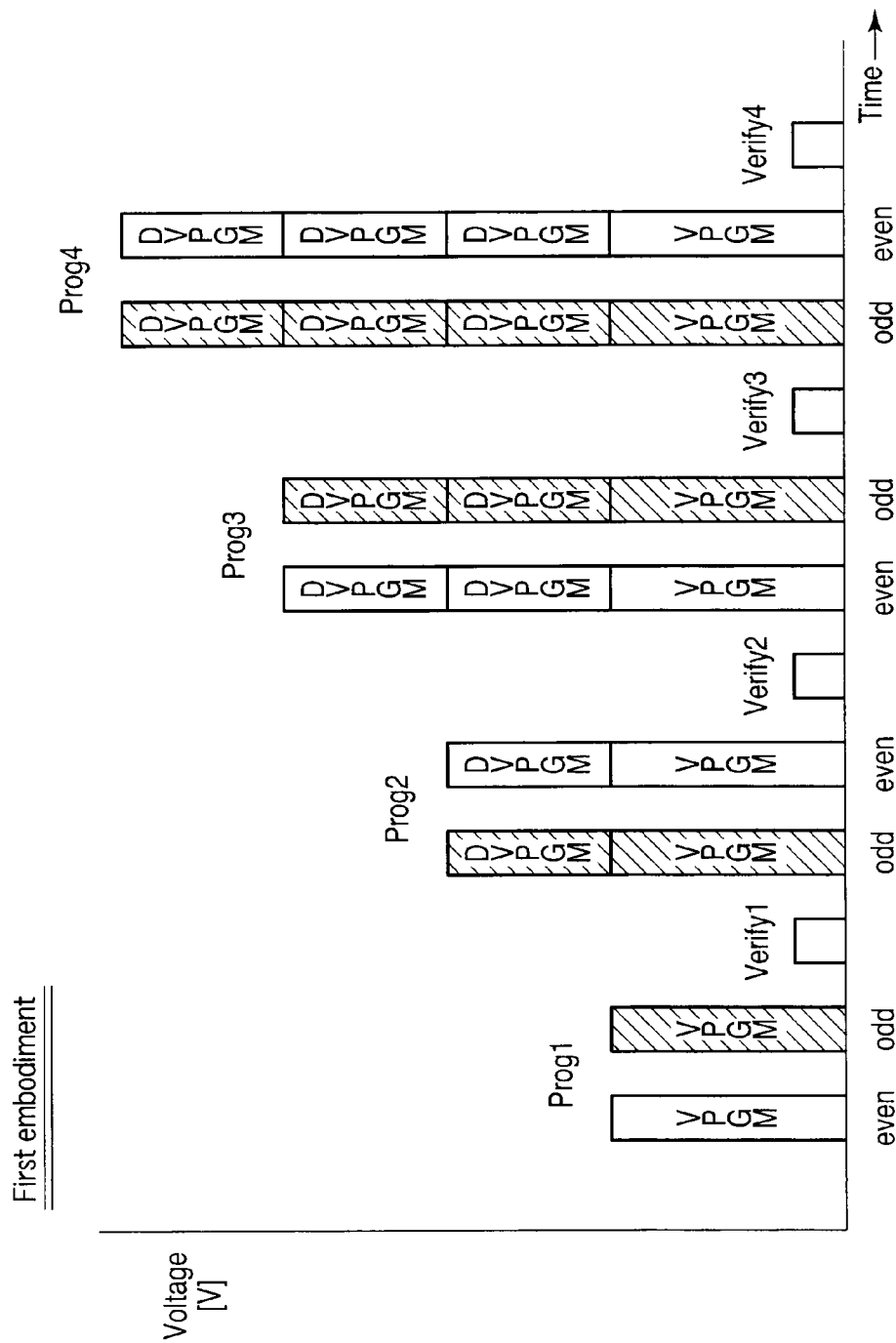
FIG. 6 is a timing chart illustrating a data program sequence of the semiconductor memory device according to the first embodiment.

Then, verify read is executed from the cell relating to the selected bit line even (BL)/odd (BL) (Verify1 in FIG. 6). To be more specific, the control circuit 17 executes data read of the selected cell by a sense amplifier (not shown) in the column decoder.

(Step ST15 (Verify Check))

Thereafter, based on the result of the verify read which has been executed in the cell relating to the selected bit line even (BL)/odd (BL), the control circuit 17 determines whether data program has been executed to a desired threshold distribution (e.g. "1" state→"0" state).

If it is determined in step ST15 that data program has been executed to the desired threshold distribution (Pass), this operation is finished (End).

(Step ST16)

If it is determined in step ST15 that data program has not been executed to the desired threshold distribution (Fail), the control circuit 17 changes the order of data programs (Program even (BL), Program odd (BL)) of steps ST12 and ST13.

(Step ST17 (Vpgm+ΔVpgm))

Subsequently, with respect to the cell in which data program fails to be executed to the desired threshold, VPGM is added to the write voltage (+ΔVpgm) and data program is executed once again (step-up program). After this step, like step ST11, program data and corresponding addresses may be loaded once again from the outside into the column decoder 12, but the illustration of this step is omitted here.

As a result, in second-cycle data program (Program2) in FIG. 6, the order of even/odd data programs is changed (Program odd (BL), Program even (BL)) and data program is executed.

Then, similarly, verify read is executed from the cell relating to the selected bit line even (BL)/odd (BL) (Verify2).

Subsequently, until data program is successfully executed to the predetermined threshold, similar data program and verify are executed (Program3•Verify3, Program4•Verify4, . . . ). At the time of third and fourth programs (Program3, Program4), the order of even/odd data programs is similarly changed.

<3. Advantageous Effects>

According to the semiconductor memory device and data program method of the present embodiment, at least the following advantageous effects (1) and (2) can be obtained.

(1) In the data program of even (BL)/odd (BL), the effect of capacitive coupling is reduced, and a decrease in read margin can be prevented.

As has been described above, the semiconductor memory device 10 of the present embodiment includes the control circuit (sequencer) 17 which controls the memory cell array 11 and column decoder 12 in the following manner. The control circuit 17 loads program data from the outside (ST11); executes first data program relating to the first even-numbered bit line (ST12); executes second data program relating to the first odd-numbered bit line (ST13); executes verify read of the programmed bit lines (ST14); determines whether the value of the verify read has been programmed up to the predetermined threshold (ST15); and changes the order of the first and second data programs if the data program failed to be executed to the predetermined threshold, executes second data program relating to the first odd-numbered bit line and then executes first data program relating to the first even-numbered bit line (ST16).

As in a comparative example which will be described later, if data program is executed in the fixed order of data programs in the even-numbered bit line (even (BL)) and odd-numbered bit line (odd (BL)), the program on the odd (BL) side is always executed after the program on the even (BL) side. Thus, the amount of variation of the threshold value in one program operation is always greater on the even (BL) side, and therefore the data program is finished earlier. Hence, due to the above-described effect of capacitive coupling, the even-side threshold distribution becomes broader than the odd-side threshold distribution. Besides, if the conditions of program voltages for the even side and odd side are different depending on the order of data program, the difference between the even side and the odd side becomes more conspicuous.

However, in the present embodiment, as described above, the control circuit 17 changes the order of even/odd data programs. There, since the order of even/odd data programs is alternately changed, the variation in threshold distribution between the even (BL) and odd (BL) can be reduced.

For example, as shown in FIG. 6, in the first program cycle (Program1), data program is executed in the order of (1) even→(2) odd.

Subsequently, in the next program cycle (Program2), as shown in FIG. 6, the order of even/odd data programs is changed, and data program is executed in the order of (1) odd→(2) even. In this manner, by alternately changing the order of program, the influence of capacitive coupling can be reduced, and the ease in data program in the even/odd (BL) can be made substantially equal between the even (BL) side and odd (BL) side.

Figure 7:
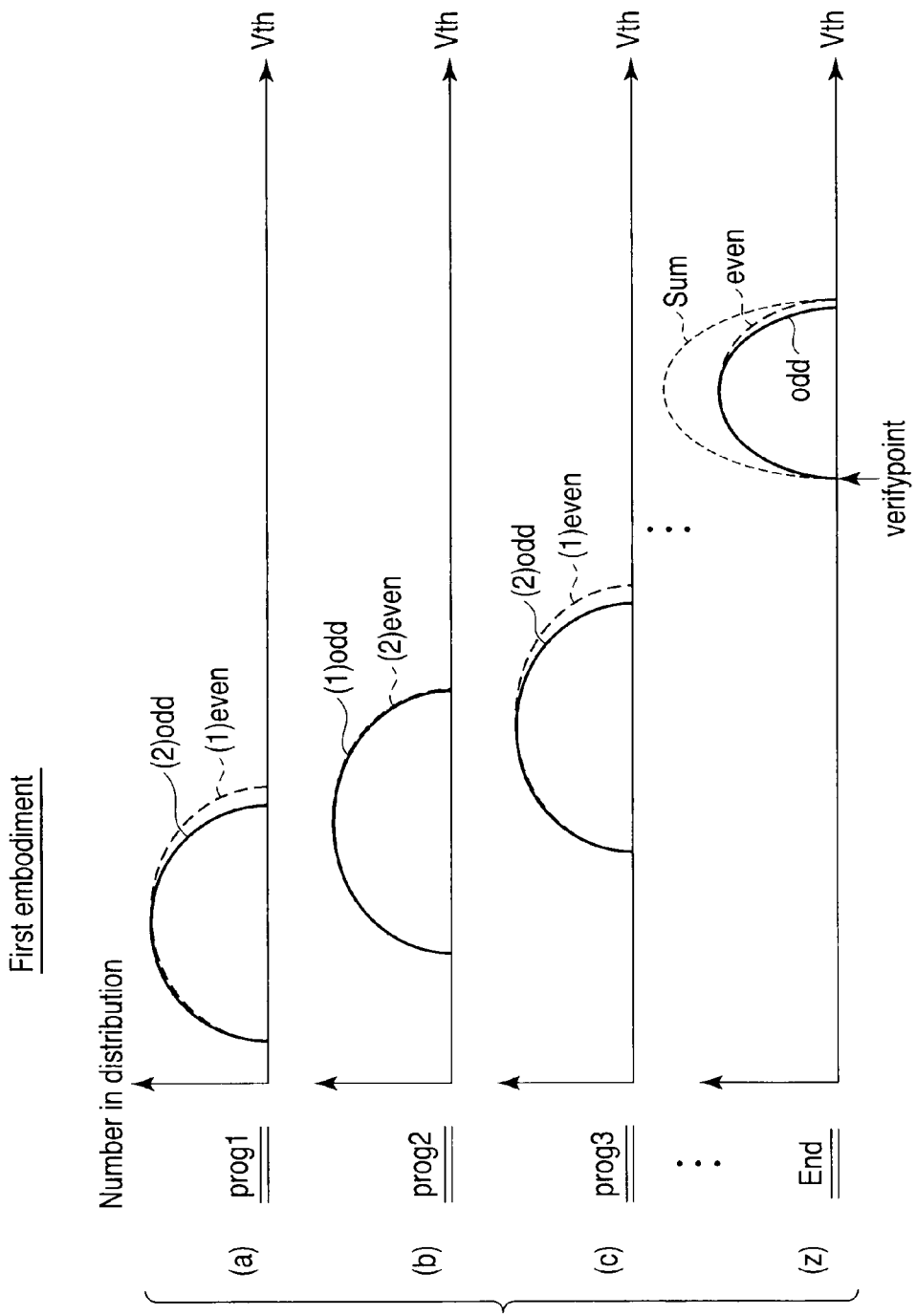
FIG. 7 shows a threshold distribution in data program of the semiconductor memory device according to the first embodiment.

Thus, as shown in part (z) of FIG. 7, the timings of the end of even/odd data programs can finally be made substantially equal. This embodiment is advantageous in that it is possible to prevent such a phenomenon that the threshold of the even (BL) side varies after the end of the data program on the odd (BL) side and the distribution of the odd side is broadened and the read margin is decreased by the inter-cell interference effect. Moreover, the reliability can advantageously be improved.

The above-described effect of capacitive coupling is more conspicuous in the generations, such as the 20 nm generation and 10 nm generation, in which microfabrication is further advanced. In this respect, this embodiment is also advantageous in micro fabrication.

(2) The microfabrication and the reduction in manufacturing cost can advantageously be achieved.

In order to suppress the broadening of the above-described threshold distribution between the even and odd sides, it is thinkable to separately set the voltage of the step-up width DVPGM of VPGM for the even side and odd side, for example, to set the initial VPGM for the odd side to be lower than the initial VPGM for the even side. If this setting is implemented, however, it also becomes desirable to vary DVPASS and VPASS which are voltages applied to the non-selected WLs at the time of data program. If parameters, such as DVPGM, initial VPGM, DVPASS and VPASS, are prepared individually for the even side and odd side in order to implement this setting, it would be necessary to prepare double the number of kinds of parameters, despite there being plural kinds of DVPGM, initial VPGM and VPASS at present. Since the number of registers for storing the parameters is limited, it is preferable to reduce the number of registers as small as possible. This being the case, a method is desired for suppressing the broadening of the threshold distribution without increasing the number of parameters.

According to the present embodiment, it should suffice if similar even/odd data programs are executed by changing the order of even/odd data programs, and therefore it is not necessary to prepare the above-described double the number of kinds of parameters and registers. In this respect, the microfabrication and the reduction in manufacturing cost can advantageously be achieved.

[Second Embodiment (An Example in which Capacitive Coupling of a Further Neighboring Bit Line is Reduced)]

Figure 8:
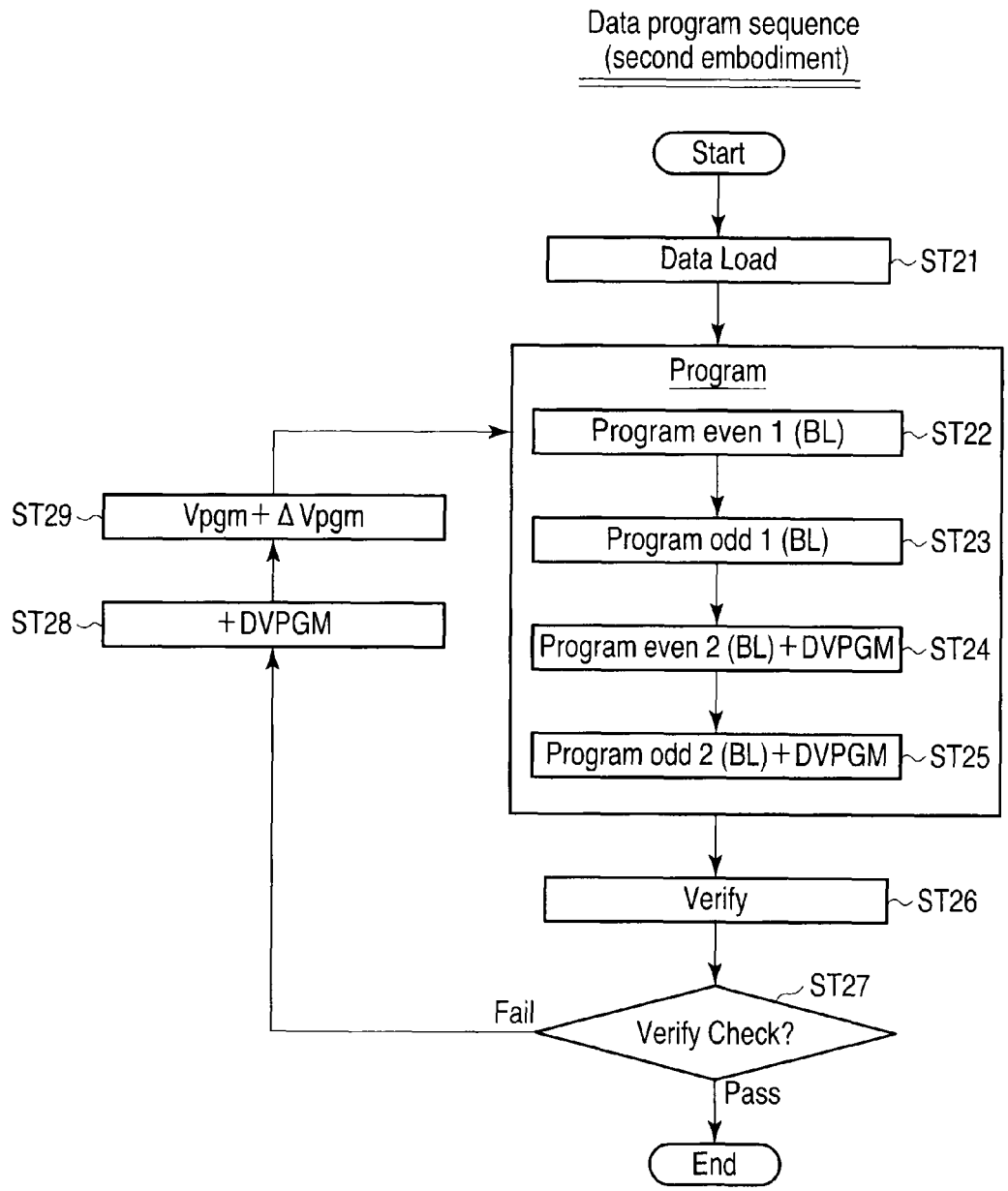
FIG. 8 is a flow chart illustrating a data program sequence of a semiconductor memory device according to a second embodiment.
Figure 9:
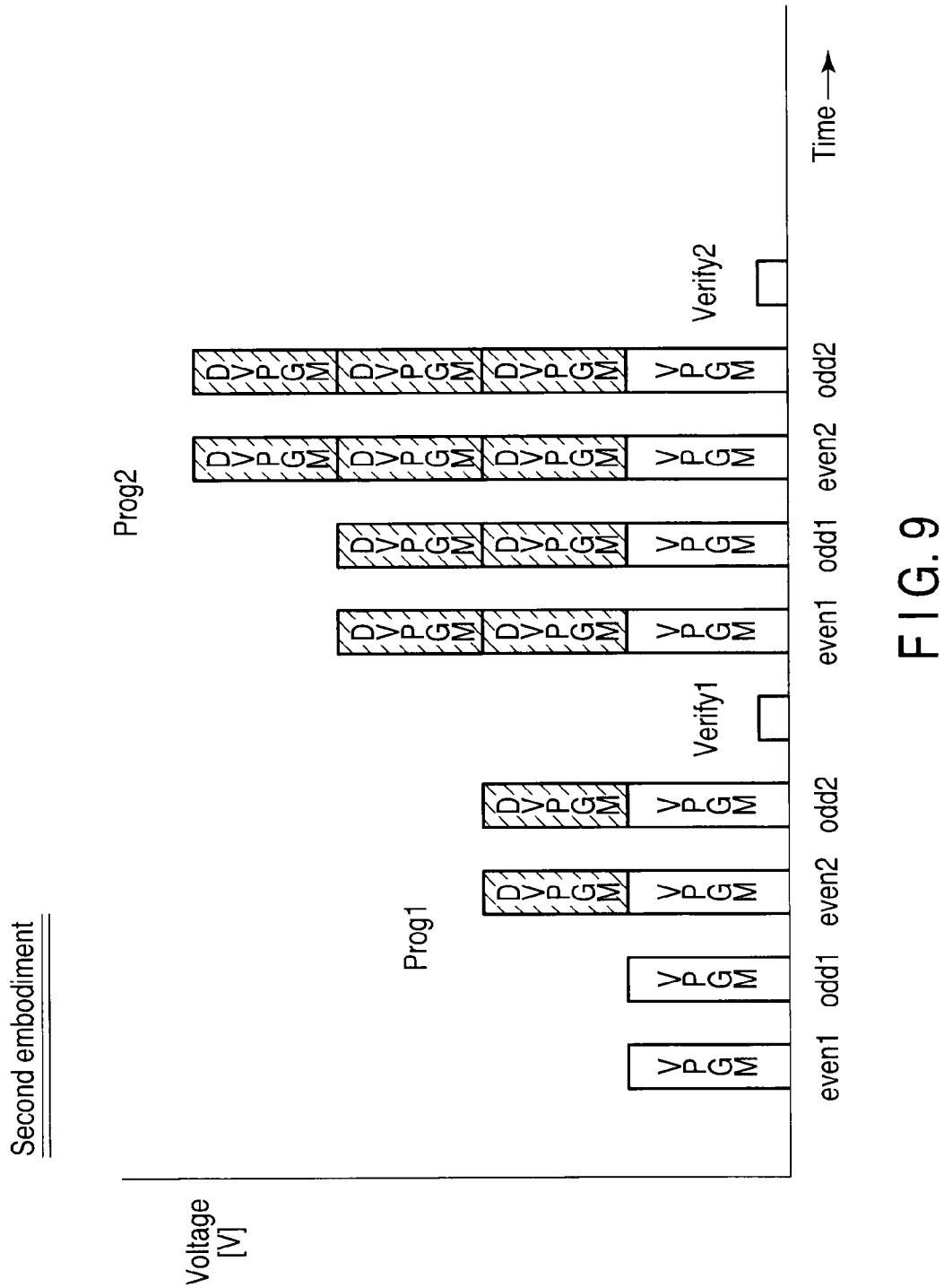
FIG. 9 is a timing chart illustrating a data program sequence of the semiconductor memory device according to the second embodiment.

Next, a semiconductor memory device according to a second embodiment is described with reference to FIG. 8 to FIG. 10. This embodiment relates to an example in which capacitive coupling of a further neighboring bit line, which neighbors a neighboring bit line, is reduced. In this description, a detailed description of the parts common to those of the first embodiment is omitted.

As the generation advances, the influence of the inter-cell interference effect from not only a neighboring BL, but also from a further neighboring BL which neighbors the neighboring BL, becomes greater. In order to reduce the inter-cell interference effect from the further neighboring bit line BL, the following program method is proposed, in which neighboring bit lines BL shown in FIG. 2 are further divided into even bit lines (BL) and odd bit lines (BL) in an order like even 1, odd 1, even 2 and odd 2.

<Data Program Operation>

The data program operation of the semiconductor memory device according to the second embodiment is described. This description will be given with reference to a flow chart of FIG. 8 and a timing chart of FIG. 9.

(Step ST22 (Program Even 1 (BL)))

After data load (ST21) as described above, the control circuit 17 programs data in the selected bit line even 1 (BL) (first data program). In this case, the other bit lines (odd 1, even 2, odd 2) are set in the non-write state (this process is the same as described above, so a description is omitted).

(Step ST23 (Program Odd 1 (BL)))

Subsequently, the control circuit 17 programs data in the selected bit line odd 1 (BL) (second data program).

(Step ST24 (Program even 2 (BL)+DVPGM))

Then, the control circuit 17 programs data in the selected bit line even 2 (BL) by applying thereto a stepped-up voltage (+DVPGM) (third data program).

(Step ST25 (Program Odd 2 (BL)+DVPGM))

Subsequently, the control circuit 17 programs data in the selected bit line odd 2 (BL) by applying thereto a stepped-up voltage (+DVPGM) (fourth data program).

(Step ST27 (Verify Check))

Thereafter, based on the result of the verify read which has been executed in the cell relating to the selected bit lines even 1 (BL), odd 1 (BL), even 2 (BL) and odd 2 (BL), the control circuit 17 determines whether data program has been executed to a desired threshold distribution (e.g. "1" state→"0" state).

If it is determined in step ST27 that data program has successfully been executed to the desired threshold distribution (Pass), this operation is finished (End).

(Step ST28 (+DVPGM))

If it is determined in step ST27 that data program fails to be executed to the desired threshold distribution (Fail), the control circuit 17 further applies the stepped-up voltage (+DVPGM) to the even 1 (BL), odd 1 (BL), even 2 (BL) and odd 2 (BL).

(Step ST29 (Vpgm+ΔVpgm))

Subsequently, in the same manner as described above, with respect to the cell in which data program fails to be executed to the desired threshold, VPGM is added to the program voltage (+ΔVpgm) and data program is executed once again (step-up program).

Thereafter, until data program is successfully executed to the predetermined threshold, similar data program and verify (Program2, Verify2, . . . ) are executed.

<Advantageous Effects>

According to the semiconductor memory device and data program method of the second embodiment, at least the same advantageous effects (1) and (2) as described above can be obtained. Furthermore, according to the second embodiment, the following advantageous effects (3) and (4) can be obtained.

(3) The inter-cell interference effect from a further neighboring bit line, which neighbors a neighboring bit line, can be reduced.

The second embodiment differs from the first embodiment in that the control circuit 17 in the semiconductor memory device controls data program by further dividing the neighboring bit lines BL shown in FIG. 2 into the even bit lines (BL) and odd bit lines (BL) in an order like even 1, odd 1, even 2 and odd 2.

To be more specific, the control circuit 17 executes first data program relating to the first even-numbered bit line (even 1) (ST22);

executes second data program relating to the first odd-numbered bit line (odd 1) (ST23);

executes third data program relating to the second even-numbered bit line (even 2) which neighbors the first even-numbered bit line (ST24); and executes fourth data program relating to the second odd-numbered bit line (odd 2) which neighbors the first odd-numbered bit line (ST25).

Thus, as indicated by a broken line in FIG. 10, the selected cells for data program are a four-cell (4 Cell) unit, and the unit of selected cells can be increased, compared to 2 cell (2 Cell) unit in a comparative example which will be described later.

For example, in a cycle T1 in FIG. 10, the cell relating to the first even-numbered bit line (even 1) is a selected cell. In a cycle T2, the cell relating to the first odd-numbered bit line (odd 1) is a selected cell. In a cycle T3, the cell relating to the second even-numbered bit line (even 2), which neighbors the first even-numbered bit line, is a selected cell. Similarly, in a cycle T4, the cell relating to the second odd-numbered bit line (odd 2), which neighbors the first odd-numbered bit line, is a selected cell.

By executing the control as described above, the influence of not only the capacitive coupling from the neighboring BL but also the capacitive coupling from the further neighboring BL (e.g. capacitance Cp' in cycle T1 in FIG. 10), which neighbors the neighboring BL, can advantageously be reduced.

(4) The reliability can be improved.

In this embodiment, the stepped-up voltage (+DVPGM) is applied in steps ST24 and ST25. In addition, in step ST28, if it is determined in step ST27 that data program fails to be executed to the desired threshold (Fail), the control circuit 17 further applies the stepped-up voltage (+DVPGM) to the even 1 (BL), odd 1 (BL), even 2 (BL) and odd 2 (BL).

The reliability can advantageously be improved by applying the stepped-up voltage individually or generally in this manner.

Various modifications can be applied, where necessary, to the second embodiment, without departing from the spirit of the second embodiment.

Modifications 2-1 to 2-3 will be described below, with reference to FIG. 11, FIG. 12 and FIG. 13.

[Modification 2-1 (An Example in which the Order of Data Program is Changed so as to Begin from the Last)]

Modification 2-1 is described with reference to FIG. 11. Modification 2-1 relates to an example in which the order of data program is changed. A detailed description of the parts common to those of the second embodiment is omitted.

Figure 11:
FIG. 11 is a timing chart illustrating a data program sequence of a semiconductor memory device according to Modification 2-1.

As shown in FIG. 11, Modification 2-1 differs from the second embodiment in that the order of data program in a second-cycle data program (Program 2) is changed so as to begin in an order reverse to the order of data program in a first-cycle data program (Program 1) (even 1, odd 1, even 2, odd 2→odd 2, even 2, odd 1, even 1).

In this case, for example, after the above-described step ST27, such step ST2-1 may be added as to change the order of data program in the second-cycle data program (Program 2) so as to begin in an order reverse to the order of data program in the first-cycle data program (Program 1).

According to Modification 2-1, the variance of the threshold distribution between even 1, odd 1, even 2 and odd 2 can advantageously be reduced by further alternately changing the order of data program of even 1, odd 1, even 2 and odd 2.
[Modification 2-2 (An Example in which Data Program is First Executed from the Even 1 and Even 2 Side)]

Modification 2-2 is described with reference to FIG. 12. Modification 2-2 relates to an example in which data program is first executed from the even 1 and even 2 side. A detailed description of the parts common to those of the second embodiment is omitted.

Figure 12:
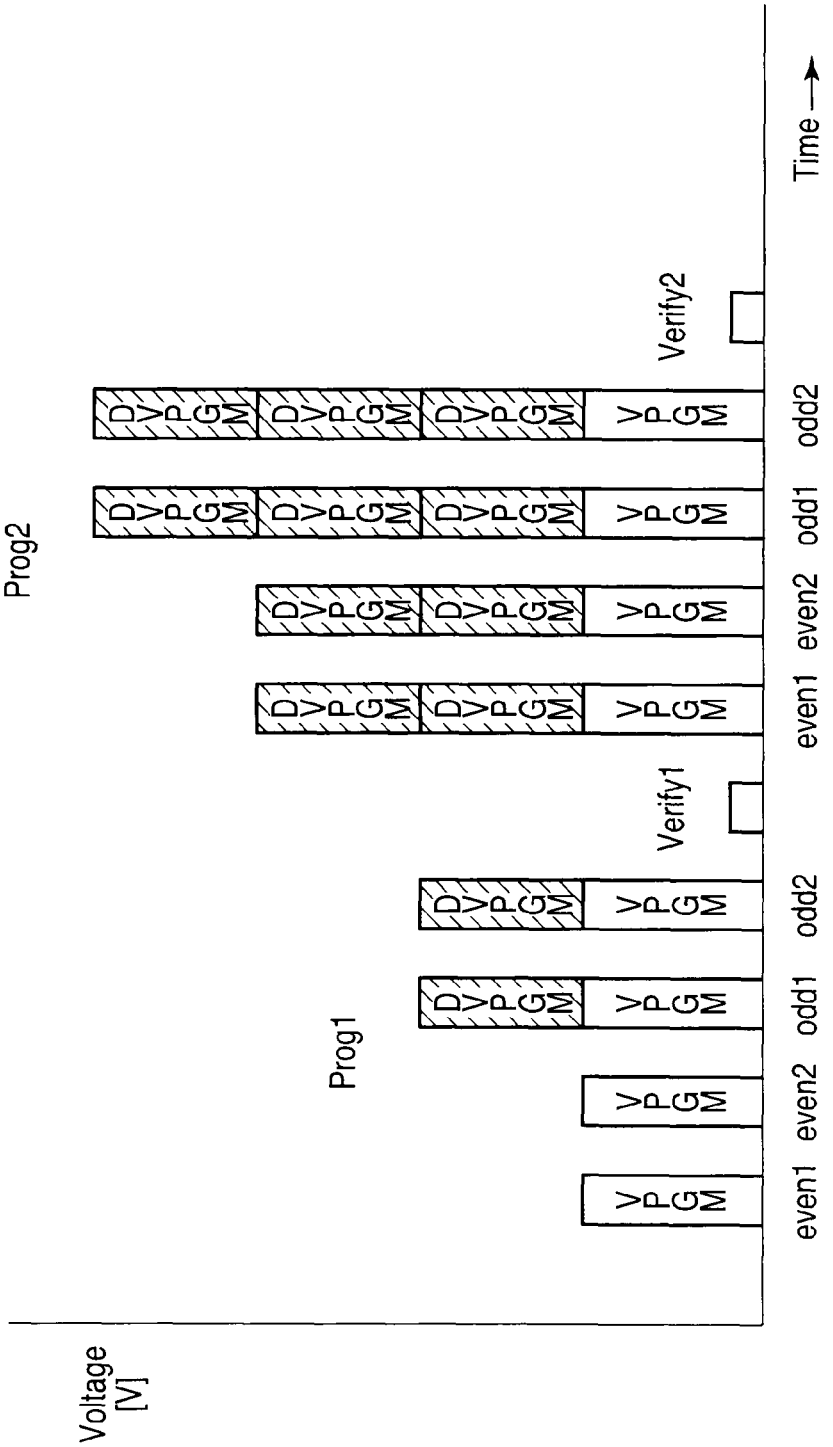
FIG. 12 is a timing chart illustrating a data program sequence of a semiconductor memory device according to Modification 2-2.

As shown in FIG. 12, Modification 2-2 differs from the second embodiment in that data program is first executed from the even 1 and even 2 side, and then data program is executed on the odd 1 and odd 2 side.

In this case, for example, in the above-described steps ST22 to ST25, program may be controlled in the order of even 1, even 2, odd 1 and odd 2.
[Modification 2-3 (An Example in which the Order of Data Program is Further Changed)]

Modification 2-3 is described with reference to FIG. 13. Modification 2-3 relates to an example in which the order of program in Modification 2-2 is further changed. A detailed description of the parts common to those of the second embodiment is omitted.

Figure 13:
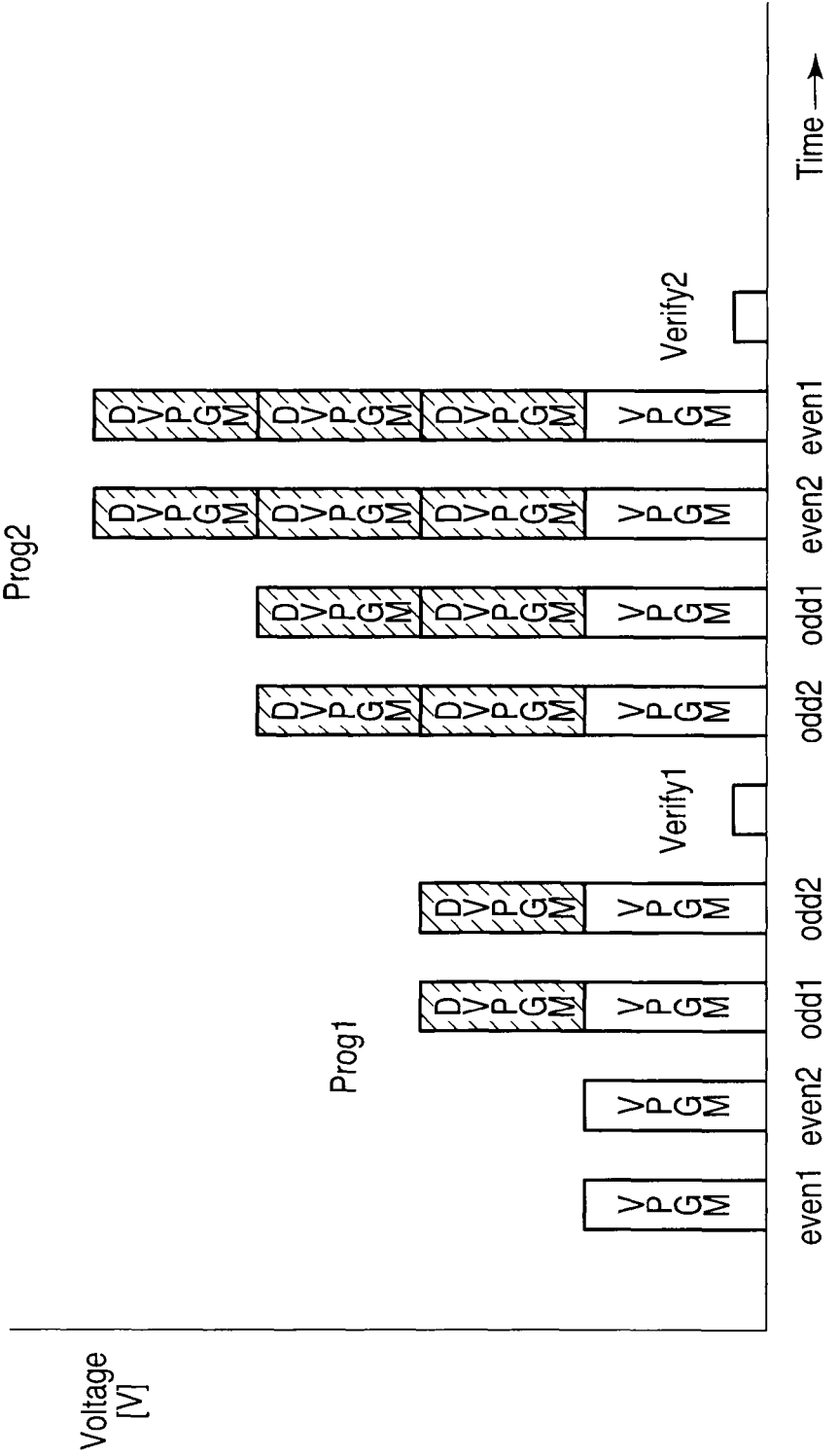
FIG. 13 is a timing chart illustrating a data program sequence of a semiconductor memory device according to Modification 2-3.

As shown in FIG. 13, Modification 2-3 differs from the second embodiment in that the order of data program in a second-cycle data program (Program 2) is changed so as to begin in an order reverse to the order of data program in a first-cycle data program (Program 1) (even 1, even 2, odd 1, odd 2→odd 2, odd 1, even 2, even 1).

In this case, for example, after the above-described step ST27, such step ST2-3 may be added as to change the order of data program in the second-cycle data program (Program 2) so as to begin in an order reverse to the order of data program in the first-cycle data program (Program 1).
[Third Embodiment (An Example in which Capacitive Coupling of a Further Neighboring Bit Line is Reduced)]

Figure 15:
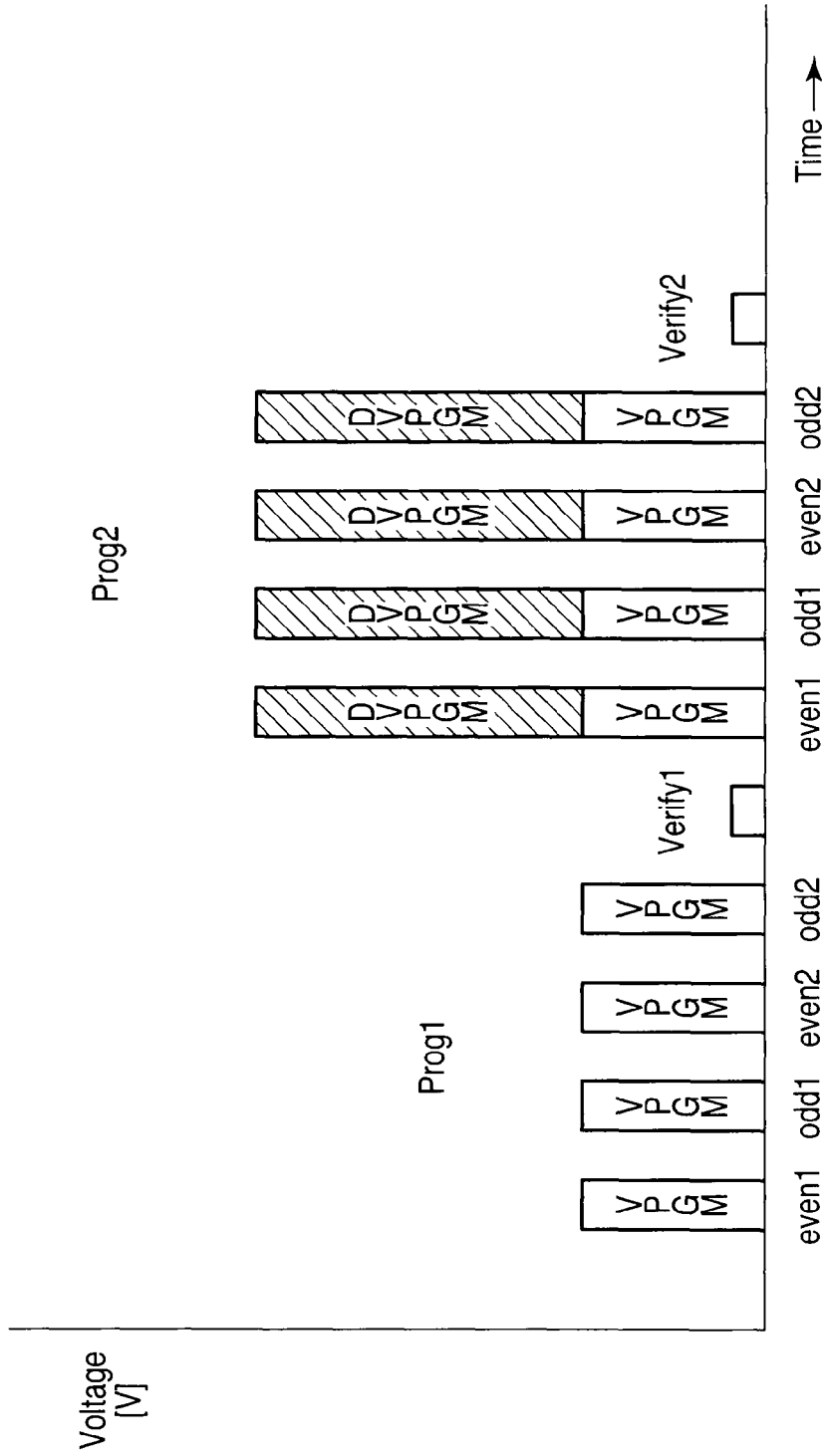
FIG. 15 is a timing chart illustrating a data program sequence of the semiconductor memory device according to the third embodiment.

Next, a semiconductor memory device according to a third embodiment is described with reference to FIG. 14 to FIG. 15. This embodiment also relates to an example in which capacitive coupling of a further neighboring bit line, which neighbors a neighboring bit line, is reduced. In this description, a detailed description of the parts common to those of the first embodiment is omitted.
<Data Program Operation>

The data program operation of the semiconductor memory device according to the third embodiment is described. This description will be given with reference to a flow chart of FIG. 14 and a timing chart of FIG. 15.

As shown in these Figures, the data program operation of the third embodiment differs from that of the second embodiment in that step-up program is not executed in steps ST34 and ST35, and only DVPGM is added in the second cycle in which data program is executed in once programmed cells (ST38).

In the same manner as described above, in step ST32, data program is first executed only in the even 1, and data program is not executed in the other bit lines. Then, in step ST33, data program is executed only in the odd 1, and data program is not executed in the other bit lines. Subsequently, in steps ST34 and ST35, data program is similarly executed only in even 2 and odd 2, respectively, without adding the voltage of DVPGM. Thereafter, verify is executed. Only in step ST38, data program is executed once again with the added voltage of DVPGM in the cells in which data program fails to be executed to the desired threshold value.

According to the third embodiment, at least the advantageous effects (1), (2) and (3) as described above can be obtained. Furthermore, the present embodiment can be applied, where necessary.

Various modifications can be applied, where necessary, to the third embodiment, without departing from the spirit of the third embodiment. Modifications 3-1 to 3-3 will be described below, with reference to FIG. 16, FIG. 17 and FIG. 18.
[Modification 3-1 (An Example in which the Order of Data Program is Changed so as to Begin from the Last)]

Modification 3-1 is described with reference to FIG. 16. Modification 3-1 relates to an example in which the order of data program is changed. A detailed description of the parts common to those of the third embodiment is omitted.

Figure 16:
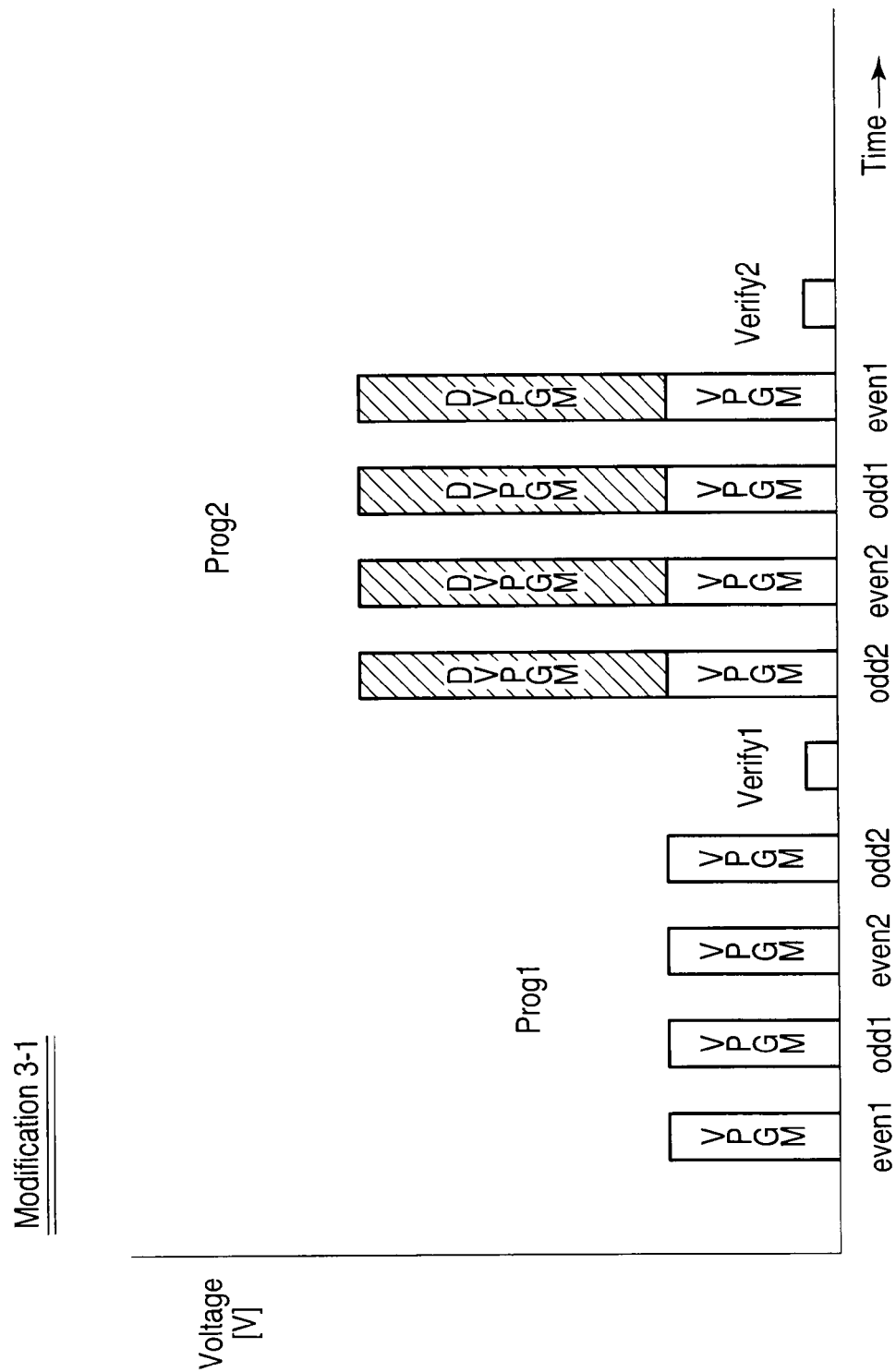
FIG. 16 is a timing chart illustrating a data program sequence of a semiconductor memory device according to Modification 3-1.

As shown in FIG. 16, Modification 3-1 differs from the third embodiment in that the order of data program in a second-cycle data program (Program 2) is changed so as to begin in an order reverse to the order of data program in a first-cycle data program (Program 1) (even 1, odd 1, even 2, odd 2→odd 2, even 2, odd 1, even 1).

In this case, for example, after step ST37, such step ST3-1 may be added as to change the order of data program in the second-cycle data program (Program 2) so as to begin in an order reverse to the order of data program in the first-cycle data program (Program 1).

According to Modification 3-1, the variance of the threshold distribution between even 1, odd 1, even 2 and odd 2 can advantageously be reduced by further alternately changing the order of data program of even 1, odd 1, even 2 and odd 2.
[Modification 3-2 (An Example in which Data Program is First Executed from the Even 1 and Even 2 Side)]

Modification 3-2 is described with reference to FIG. 17. Modification 3-2 relates to an example in which data program is first executed from the even 1 and even 2 side. A detailed description of the parts common to those of the third embodiment is omitted.

Figure 17:
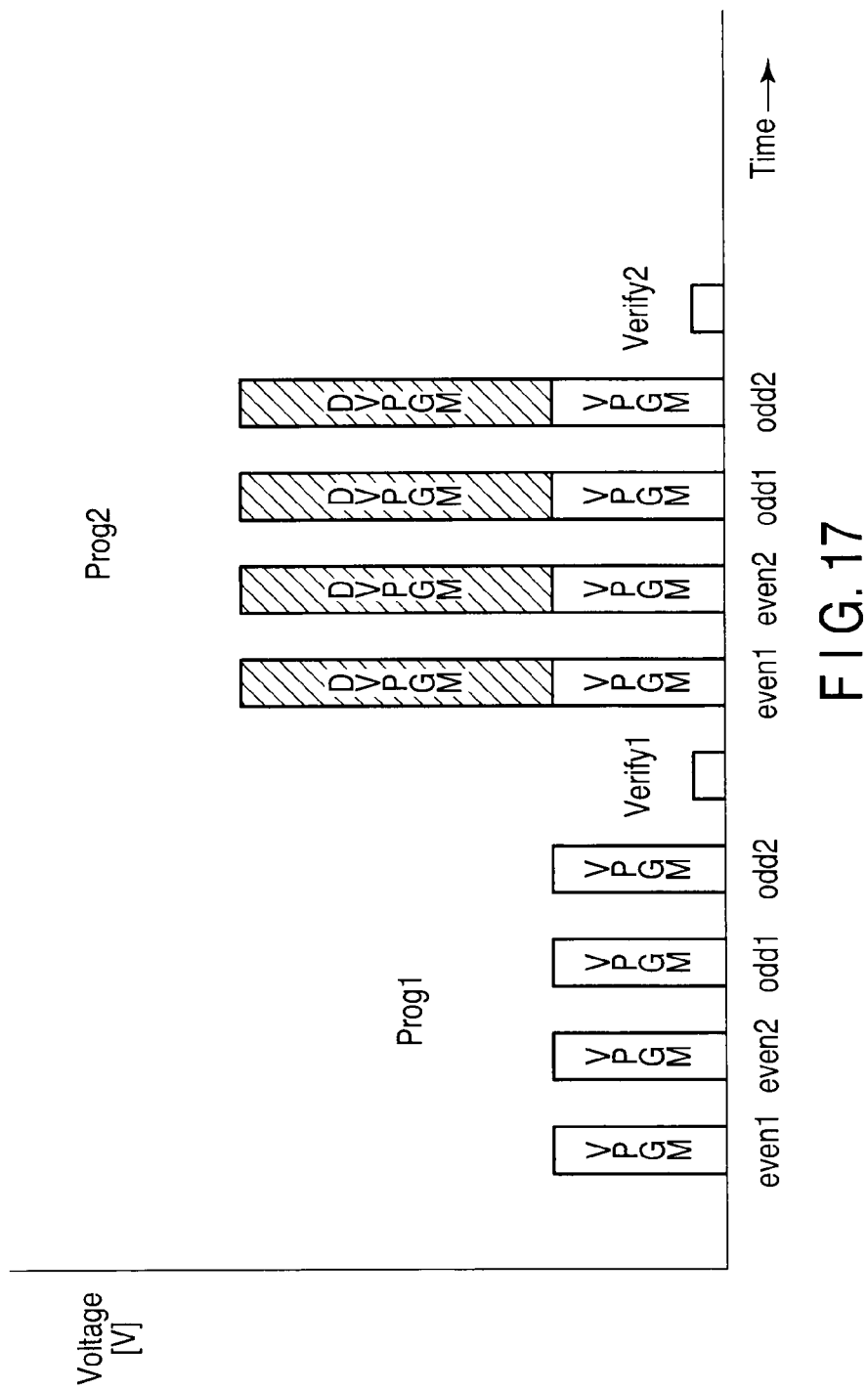
FIG. 17 is a timing chart illustrating a data program sequence of a semiconductor memory device according to Modification 3-2.

As shown in FIG. 17, Modification 3-2 differs from the third embodiment in that data program is first executed from the even 1 and even 2 side, and then data program is executed on the odd 1 and odd 2 side.

In this case, for example, in the above-described steps ST32 to ST35, data program may be controlled in the order of even 1, even 2, odd 1 and odd 2.
[Modification 3-3 (An Example in which the Order of Program is Further Changed)]

Modification 3-3 is described with reference to FIG. 18. Modification 3-3 relates to an example in which the order of program in Modification 3-2 is further changed. A detailed description of the parts common to those of the third embodiment is omitted.

As shown in FIG. 18, Modification 3-3 differs from the third embodiment in that the order of data program in a second-cycle data program (Program 2) is changed so as to begin in an order reverse to the order of data program in a first-cycle data program (Program 1) (even 1, even 2, odd 1, odd 2→odd 2, odd 1, even 2, even In this case, for example, after step ST37, such step ST3-3 may be added as to change the order of data program in the second-cycle data program (Program 2) so as to begin in an order reverse to the order of data program in the first-cycle data program (Program 1).

Furthermore, various modifications can be applied, where necessary, to the third embodiment, without departing from the spirit of the third embodiment. Modifications 4-1 and 4-2 will be described below, with reference to FIG. 19 and FIG. 20.

[Modification 4-1 (An Example in which All-program (Batch-program) is First Executed and Then Data Program is Executed Individually in Four Bit Lines Odd 1/Even 1/Odd 2/Even 2)]

Modification 4-1 is Described with Reference to FIG. 19. Modification 4-1 differs from the above-described examples in the following respects.

Figure 19:
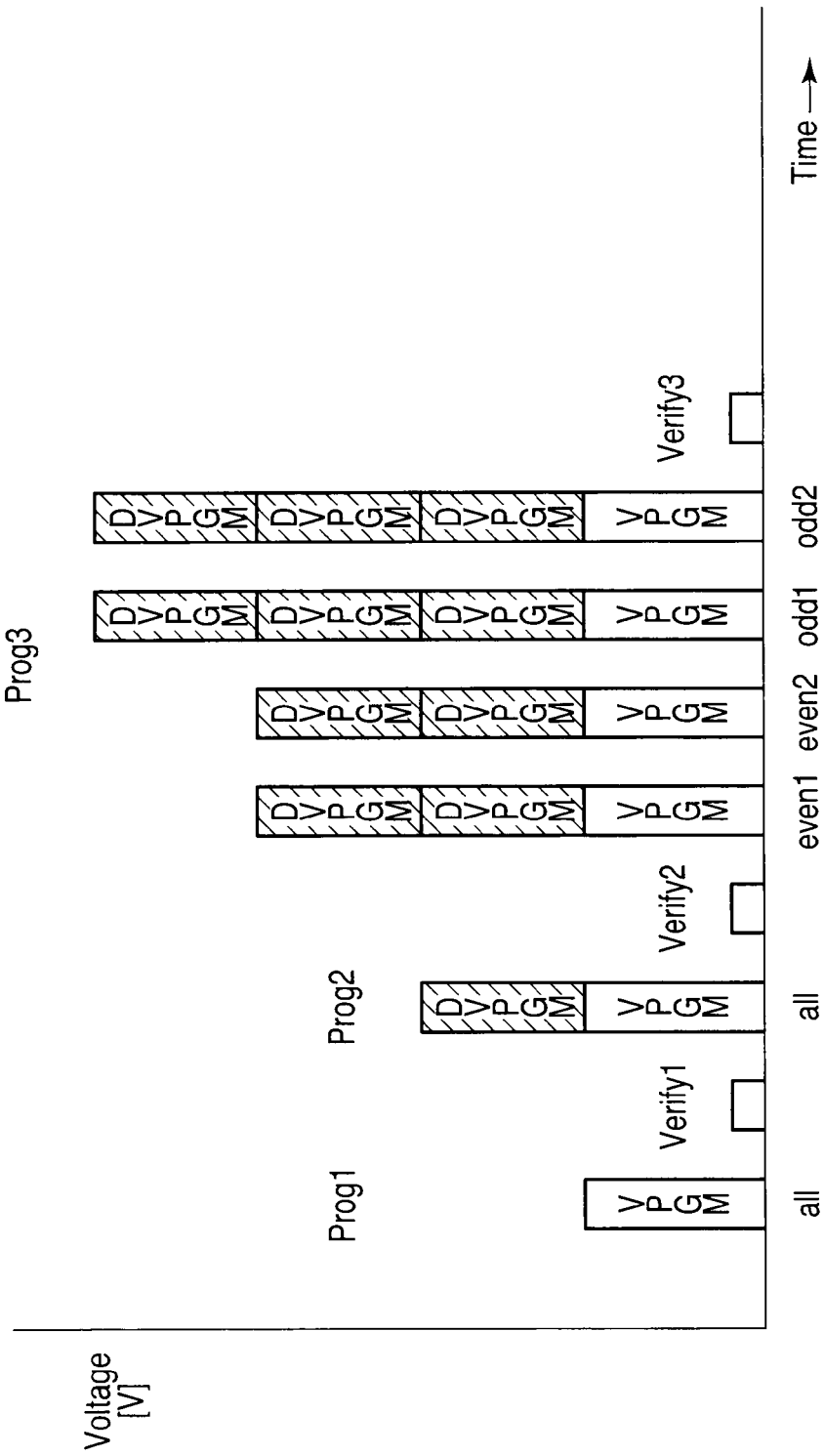
FIG. 19 is a timing chart illustrating a data program sequence of a semiconductor memory device according to Modification 4-1.

As shown in FIG. 19, in Modification 4-1, in a first-cycle data program (Program 1), all-program (batch-program) is executed in all of odd 1, even 1, odd 2 and even 2.

In a second-cycle data program (Program 2), all-program is executed in all of odd 1, even 1, odd 2 and even 2 by stepping up the application voltage by DVPGM.

Subsequently, in a third-cycle data program (Program 3), the same data program as in the above-described third embodiment is executed individually in the four bit lines odd 1/even 1/odd 2/even 2, by stepping the application voltage by DVPGM.

In this case, after step ST31, for example, an all-program step ST4-1-1, a verify step ST4-1-2, a voltage step-up step ST4-1-3, an all-program step ST4-1-4 and a verify step 4-1-5 may be added.

In Modification 4-1, all-program is first executed in consideration of performance, taking it into account that data program is not immediately completed. Subsequently, four-division data program is executed in the bit lines odd 1/even 1/odd 2/even 2. As shown in FIG. 19, when data program is next executed in the once programmed cell, double DVPGM is added, and the roughness of data program is close to 2*DVPGM.

According to Embodiment 4-1, since all-program can be executed in the first program cycle, without distinguishing the even/odd bit lines, the data program time can more advantageously be reduced.

[Modification 4-2 (An Example in which a Step-up Voltage is Varied)]

Modification 4-2 is described with reference to FIG. 20.

Figure 20:
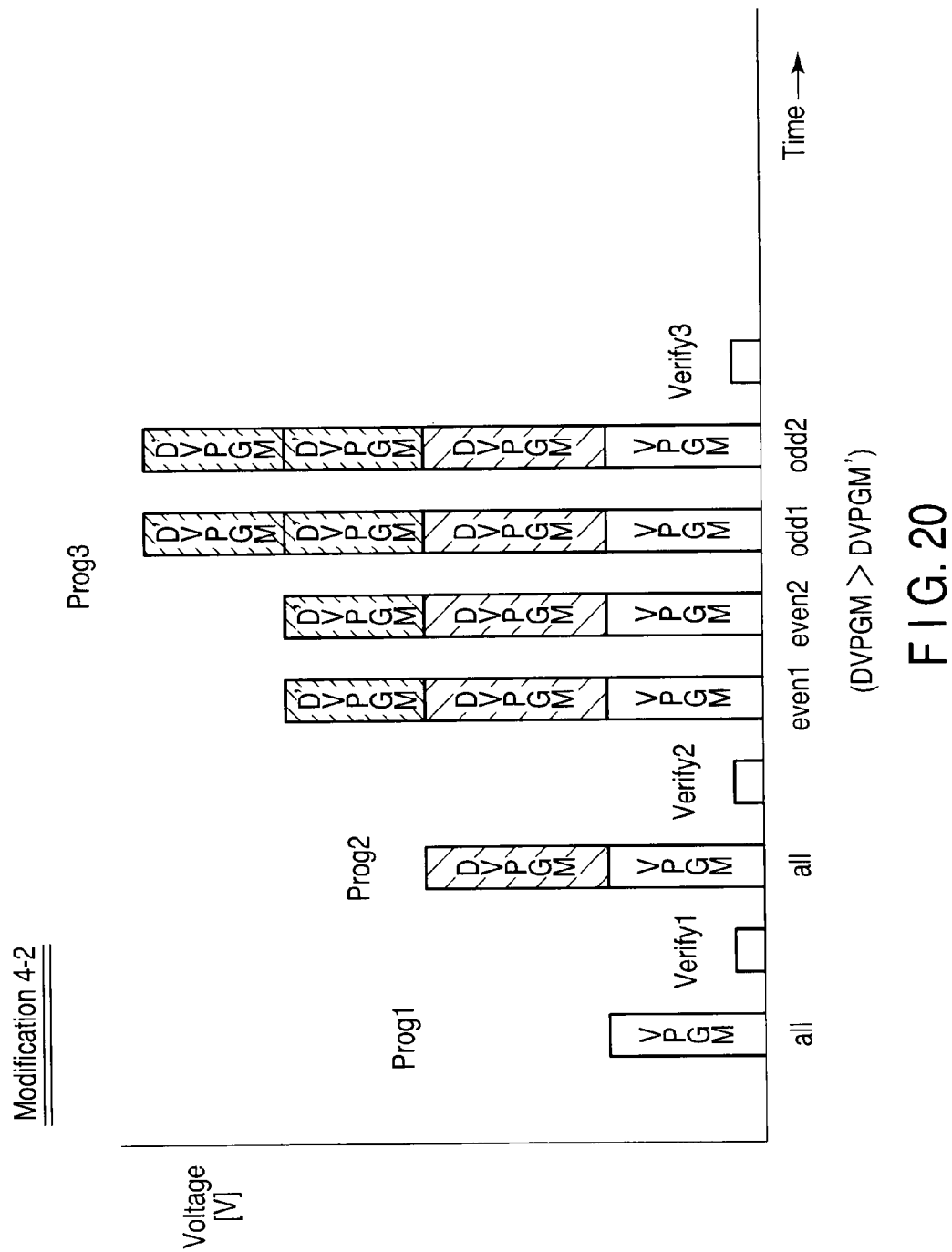
FIG. 20 is a timing chart illustrating a data program sequence of a semiconductor memory device according to Modification 4-2.

As shown in FIG. 20, Modification 4-2 differs from the third embodiment in that all-program is executed in first and second cycles in the beginning part of data program, and in a subsequent third cycle, when four-individual data program is executed in the bit lines odd 1/even 1/odd 2/even 2, the step-up voltage is varied such that a step-up voltage DVPGM' for the four-individual program becomes smaller than the step-up voltage DVPGM for all-program (DVPGM'<DVPGM).

This modification may be applied, where necessary.

[Comparative Example (An Example in which the Order of Data Program for Even/Odd Bit Lines is Not Changed)]

Next, a semiconductor memory device according to a comparative example is described FIG. 21 to FIG. 24, for the purpose of comparison with the semiconductor memory devices according to the above-described embodiments and Modifications. The comparative example differs from the first embodiment in that the order of data program for the even/odd bit lines is not changed.

<Data Program Sequence>

Figure 21:
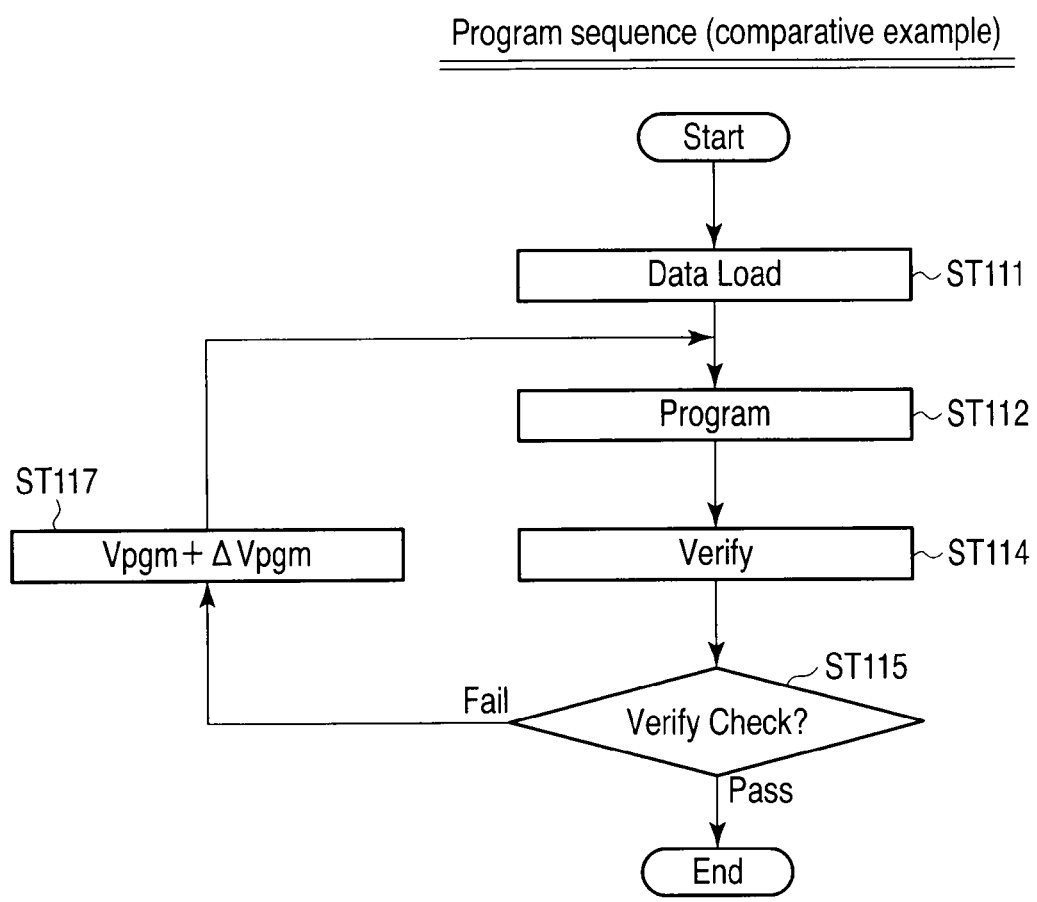
FIG. 21 is a flow chart illustrating a data program sequence of a semiconductor memory device according to a comparative example.

In the semiconductor memory device of the comparative example, data program is executed as illustrated in a flow chart of FIG. 21.

(Step ST111 (Data Load))

To start with, program data and corresponding addresses are loaded from the outside.

(Step ST112 (Program))

Then, data program is executed in the selected bit lines even (BL). In this case, the other bit lines (odd) are set in the non-program state. Subsequently, data program is similarly executed in the selected bit line odd (BL).

(Step ST114 (Verify))

Then, verify read is executed from the cell relating to the selected bit line even (BL)/odd (BL).

(Step ST115 (Verify Check))

Thereafter, based on the result of the verify read which has been executed in the cell relating to the selected bit line even (BL)/odd (BL), it is determined whether data program has been executed up to a desired threshold distribution (e.g. "1" state→"0" state). If it is determined in step ST115 that data program has been executed to the desired threshold distribution (Pass), this operation is finished (End).

(Step ST117 (Vpgm+ΔVpgm))

Subsequently, with respect to the cell in which data program fails to be executed to the desired threshold, VPGM is added to the program voltage (+ΔVpgm) and data program is executed once again (step-up program).

In the same manner as described above, until data program is successfully executed to the predetermined threshold, similar data program is executed in the selected bit lines (even (BL)/odd (BL)). When data program is executed on the even side, the odd side is non-selected, and when data program is executed on the odd side, the even side is non-selected.

Figure 22:
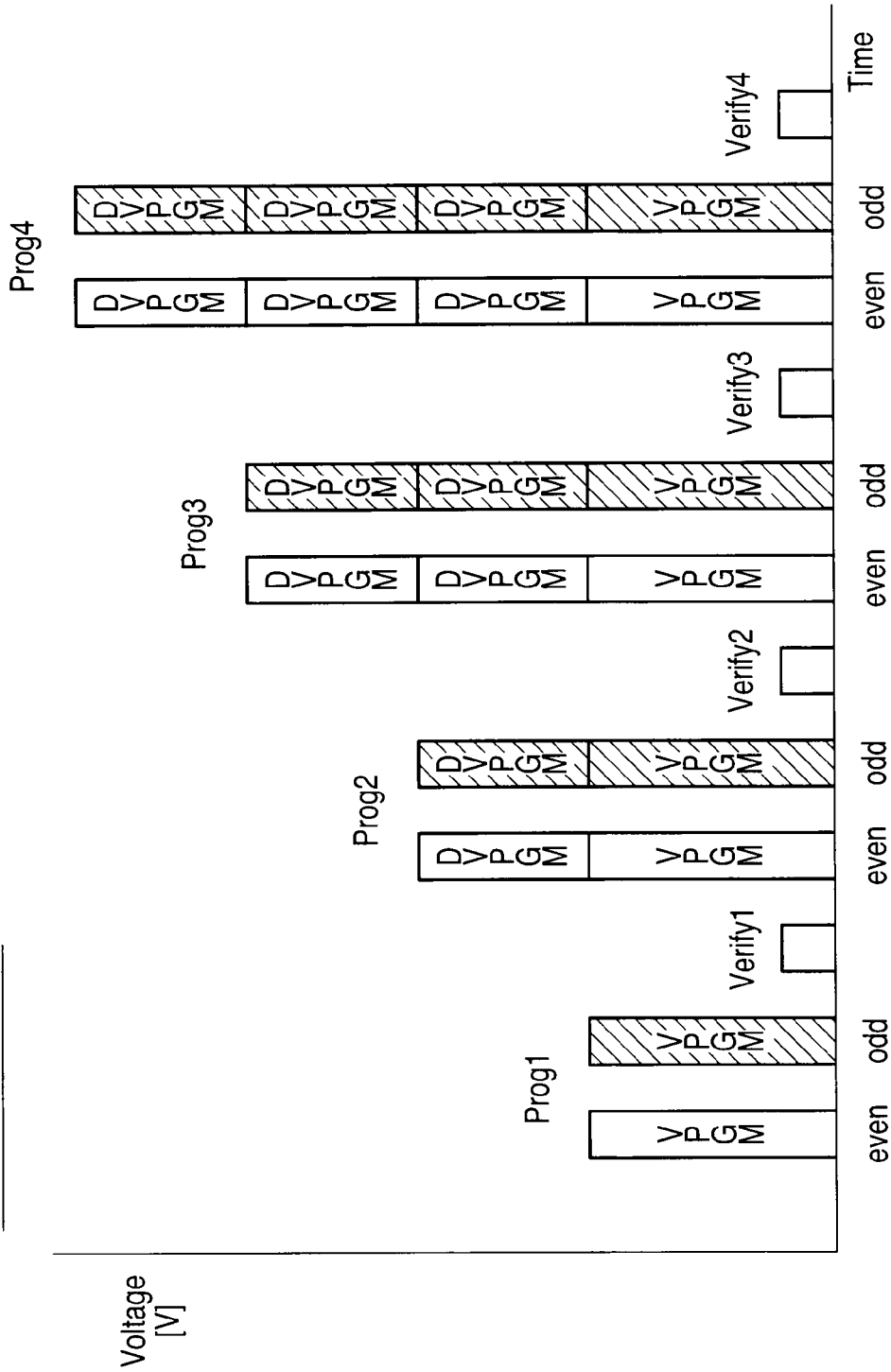
FIG. 22 is a timing chart illustrating a data program sequence of the semiconductor memory device according to the comparative example.

In the comparative example, as illustrated in FIG. 22, in step S112 (Program), the order of data program in the even/odd bit lines is unchanged even in the data program of the second and following cycles (Prog 2, Prog 3, Prog 4, . . . ). Thus, data program is executed in the order of (1) even→(2) odd.

Figure 23:
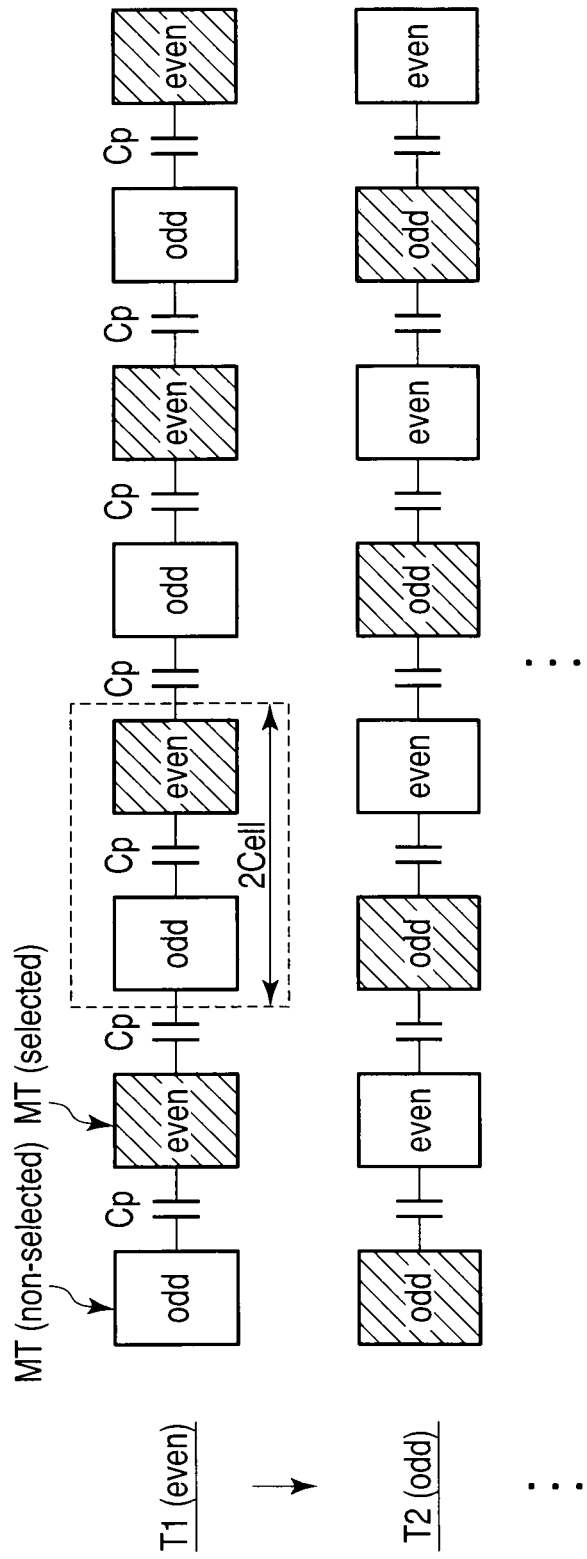
FIG. 23 illustrates the effect of capacitive coupling in data program of the semiconductor memory device according to the comparative example.

As a result, as shown in FIG. 23, data program is executed more strongly on the even side by the effect of parasitic capacitance Cp. The reason is that since data program is executed on the odd side after data program is executed on the even side, the threshold of the even side is broadened when data program is executed on the odd side.

Figure 24:
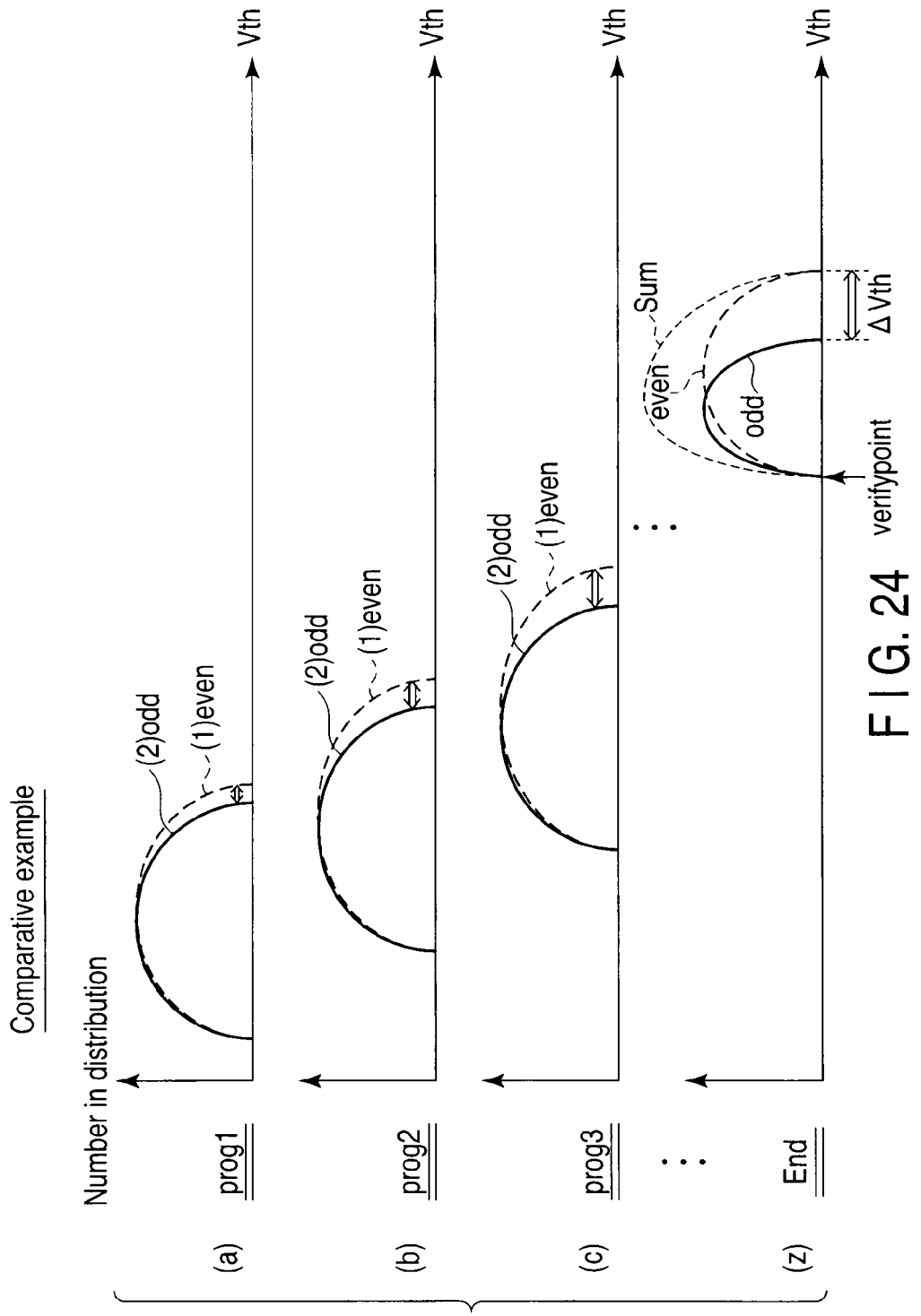
FIG. 24 shows a threshold distribution in data program of the semiconductor memory device according to the comparative example.

This influence may be illustrated by the threshold distribution, as shown in FIG. 24.

In this example, as shown in part (z) of FIG. 24, the threshold distribution on the odd (BL) side becomes broader by ΔVth than the threshold distribution on the even (BL) side. In this manner, in the comparative example, the threshold distribution is broadened, and the read margin is disadvantageously reduced.

In order to suppress the broadening of the above-described threshold distribution, it is thinkable to separately set the voltage of the step-up width DVPGM of VPGM for the even side and odd side. For example, if the DVPGM voltage for the even side is made lower than the DVPGM voltage for the odd side, the effective DVPGM can be made substantially equal.

However, if this setting is implemented, it also becomes desirable to vary DVPASS and VPASS which are voltages applied to the non-selected WLs at the time of data program. If parameters, such as DVPGM, initial VPGM, DVPASS and VPASS, are prepared individually for the even side and odd side in order to implement this setting, it would be necessary to prepare double the number of kinds of parameters, despite there being plural kinds of DVPGM, initial VPGM and VPASS at present. Since the number of registers for storing the parameters is limited, it is preferable to reduce the number of registers as small as possible. This being the case, a method is desired for suppressing the broadening of the threshold distribution without increasing the number of parameters. As a result, this is disadvantageous in microfabrication and reduction in cost.

Besides, if the generation further advances, there occurs an inter-cell interference effect from not only a neighboring BL, but also from a BL which neighbors the neighboring BL. As shown in FIG. 23, in the comparative example, the bit lines BL are divided into even bit lines and odd bit lines, and the selected cells for data program are a 2-cell unit. Thus, there is also a disadvantage that the influence from the further neighboring BL, which neighbors the neighboring BL, cannot be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory cell array including a plurality of memory cells which are arranged at intersections between a plurality of bit lines and a plurality of word lines;
a column decoder configured to apply a program voltage to the memory cells via the bit lines; and
a control circuit configured to control the memory cell array and the column decoder,
wherein the control circuit is configured to load program data from outside;
to execute a first data program in a first even-numbered bit line;
to execute a second data program in a first odd-numbered bit line;
to execute a verify read of the programmed bit lines;
to determine whether a value of the verify read is programmed up to a predetermined threshold value; and
to change, in a case where the value of the verify read fails to be programmed to the predetermined threshold value, an order of the first and second data programs, to execute the second data program in the first odd-numbered bit line, and then to execute the first data program in the first even-numbered bit line.

2. The device of claim 1, wherein the control circuit is configured to further execute a third data program in a second even-numbered bit line which neighbors the first even-numbered bit line, and to execute a fourth data program in a second odd-numbered bit line which neighbors the first odd-numbered bit line.

3. The device of claim 2, wherein in the case where the value of the verify read fails to be programmed to the predetermined threshold value, the control circuit is configured to change an order of the first, second, third and fourth programs, and to successively execute data programs in an order of the fourth, third, second and first data programs.

4. The device of claim 2, wherein when the control circuit executes the third data program in the second even-numbered bit line which neighbors the first even-numbered bit line and executes the fourth data program in the second odd-numbered bit line which neighbors the first odd-numbered bit line, the control circuit is configured to first execute the first and third data programs in the first and second even-numbered bit lines.

5. The device of claim 2, wherein in the case where the value of the verify read fails to be programmed to the predetermined threshold value, the control circuit is configured to change an order of the first, second, third and fourth programs, and to successively execute data programs in an order of the fourth, second, third and first data programs.

6. The device of claim 2, wherein the control circuit is configured to execute data programs in all of the first and second even-numbered bit lines and the first and second odd-numbered bit lines, before executing the first, second, third and fourth data programs.

7. The device of claim 2, wherein the control circuit is configured to execute no step-up program at a time of executing the first, second, third and fourth data programs.

8. The device of claim 3, wherein in the case where the value of the verify read fails to be programmed to the predetermined threshold value, the control circuit is configured to execute no step-up program when the control circuit changes the order of the first, second, third and fourth programs and successively executes data program in the order of the fourth, third, second and first data programs.

9. The device of claim 4, wherein the control circuit is configured to execute no step-up program when the control circuit executes the first and third data programs in the first and second even-numbered bit lines.

10. The device of claim 5, wherein in the case where the value of the verify read fails to be programmed to the predetermined threshold value, the control circuit is configured to execute no step-up program when the control circuit changes the order of the first, second, third and fourth programs and successively executes data programs in the order of the fourth, second, third and first data programs.

11. A control method of a semiconductor memory device comprising a memory cell array including a plurality of memory cells which are arranged at intersections between a plurality of bit lines and a plurality of word lines, the method comprising:
loading program data from outside;
executing a first data program in a first even-numbered bit line;
executing a second data program in a first odd-numbered bit line;
executing a verify read of the programmed bit lines;
determining whether a value of the verify read is programmed up to a predetermined threshold value; and
changing, in a case where the value of the verify read fails to be programmed to the predetermined threshold value, an order of the first and second data programs, executing the second data program in the first odd-numbered bit line, and then executing the first data program in the first even-numbered bit line.

12. The method of claim 11, further comprising:
executing a third data program in a second even-numbered bit line which neighbors the first even-numbered bit line; and
executing a fourth data program in a second odd-numbered bit line which neighbors the first odd-numbered bit line.

13. The method of claim 12, further comprising changing, in the case where the value of the verify read fails to be programmed to the predetermined threshold value, an order of the first, second, third and fourth programs, and successively executing data programs in an order of the fourth, third, second and first data programs.

14. The method of claim 12, further comprising first executing the first and third data programs in the first and second even-numbered bit lines, at a time of executing the third data program in the second even-numbered bit line which neighbors the first even-numbered bit line and executing the fourth data program in the second odd-numbered bit line which neighbors the first odd-numbered bit line.

15. The method of claim 12, further comprising changing, in the case where the value of the verify read fails to be programmed to the predetermined threshold value, an order of the first, second, third and fourth programs, and successively executing data programs in an order of the fourth, second, third and first data programs.

16. The method of claim 12, further comprising executing data programs in all of the first and second even-numbered bit lines and the first and second odd-numbered bit lines, before executing the first, second, third and fourth data programs.

17. The method of claim 12, further comprising executing no step-up program at a time of executing the first, second, third and fourth data programs.

18. The method of claim 13, further comprising executing, in the case where the value of the verify read fails to be programmed to the predetermined threshold value, no step-up program at a time of changing the order of the first, second, third and fourth programs and successively executing data program in the order of the fourth, third, second and first data programs.

19. The method of claim 14, further comprising executing no step-up program at a time of executing the first and third data programs in the first and second even-numbered bit lines.

20. The method of claim 15, further comprising executing, in the case where the value of the verify read fails to be programmed to the predetermined threshold value, no step-up program at a time of changing the order of the first, second, third and fourth programs and successively executing data programs in the order of the fourth, second, third and first data programs.

* * * * *